United States Patent
Aibara et al.

(10) Patent No.: US 10,792,711 B2
(45) Date of Patent: *Oct. 6, 2020

(54) SUBSTRATE PROCESSING SYSTEM, SUBSTRATE CLEANING METHOD, AND RECORDING MEDIUM

(71) Applicant: Tokyo Electron Limited, Tokyo (JP)

(72) Inventors: Meitoku Aibara, Koshi (JP); Yuki Yoshida, Koshi (JP); Hisashi Kawano, Koshi (JP); Masami Yamashita, Koshi (JP); Itaru Kanno, Tokyo (JP); Kenji Mochida, Tokyo (JP); Motoyuki Shima, Tokyo (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/215,958

(22) Filed: Dec. 11, 2018

(65) Prior Publication Data

US 2019/0118227 A1    Apr. 25, 2019

Related U.S. Application Data

(63) Continuation of application No. 14/809,387, filed on Jul. 27, 2015, now Pat. No. 10,272,478.

(30) Foreign Application Priority Data

Jul. 31, 2014  (JP) .................................. 2014-157196
Apr. 30, 2015  (JP) .................................. 2015-092918

(51) Int. Cl.
*B08B 3/08* (2006.01)
*H01L 21/02* (2006.01)
*H01L 21/67* (2006.01)

(52) U.S. Cl.
CPC .......... *B08B 3/08* (2013.01); *H01L 21/02057* (2013.01); *H01L 21/6715* (2013.01); *H01L 21/67028* (2013.01); *H01L 21/67051* (2013.01)

(58) Field of Classification Search
CPC ................. B08B 3/08; H01L 21/02057; H01L 21/67028; H01L 21/67051; H01L 21/6715
See application file for complete search history.

(56) References Cited

U.S. PATENT DOCUMENTS 8,143,203 B2   3/2012  Okamoto et al.
8,568,534 B2   10/2013  Okamoto et al.
(Continued)

FOREIGN PATENT DOCUMENTS

CN    1881085 A    12/2006
CN    101416118 A    4/2009
(Continued)

OTHER PUBLICATIONS

Taiwanese Office Action (Application No. 104124750) dated Aug. 23, 2017.
(Continued)

*Primary Examiner* — Duy Vu N Deo
(74) *Attorney, Agent, or Firm* — Burr & Brown, PLLC

(57) ABSTRACT

An object of the present invention is to obtain a high removing performance of particles. The substrate processing system according to the exemplary embodiment comprises a holding unit and a removing solution supply unit. The holding unit holds a substrate that has a treatment film formed thereon, wherein the treatment film comprises an organic solvent and a fluorine-containing polymer that is soluble in the organic solvent. The removing solution supply unit supplies to the treatment film formed on the substrate, a removing solution capable of removing the treatment film.

12 Claims, 16 Drawing Sheets

(56) References Cited

U.S. PATENT DOCUMENTS

| | | | |
|---|---|---|---|
| 10,272,478 B2* | 4/2019 | Aibara | B08B 3/08 |
| 2002/0053355 A1* | 5/2002 | Kamikawa | B08B 3/02 |
| | | | 134/30 |
| 2009/0029894 A1 | 1/2009 | Okamoto et al. | |
| 2009/0130592 A1 | 5/2009 | Wang | |
| 2010/0151690 A1 | 6/2010 | Britcher et al. | |
| 2012/0067379 A1 | 3/2012 | Okamoto et al. | |
| 2014/0041685 A1 | 2/2014 | Kaneko et al. | |
| 2014/0144465 A1 | 5/2014 | Kaneko et al. | |
| 2014/0322648 A1 | 10/2014 | Wang | |
| 2016/0035561 A1* | 2/2016 | Aibara | H01L 21/67051 |
| | | | 134/4 |
| 2016/0163534 A1 | 6/2016 | Kaneko et al. | |
| 2017/0084480 A1* | 3/2017 | Mizutani | H01J 37/32009 |

FOREIGN PATENT DOCUMENTS

| | | |
|---|---|---|
| CN | 103567169 A | 2/2014 |
| JP | 2014-123704 A1 | 7/2014 |
| TW | 201428837 A | 7/2014 |

OTHER PUBLICATIONS

Chinese Office Action (Application No. 201510463688.1) dated Jul. 19, 2018.
Takashi et al., "Evaluation of Chemically Amplified Resist Based on Adamantyl Methacrylate for 193-nm Lithography," Jan. 1995, SPIE, Proceeding of SPIE, 2438, Abstract.

* cited by examiner

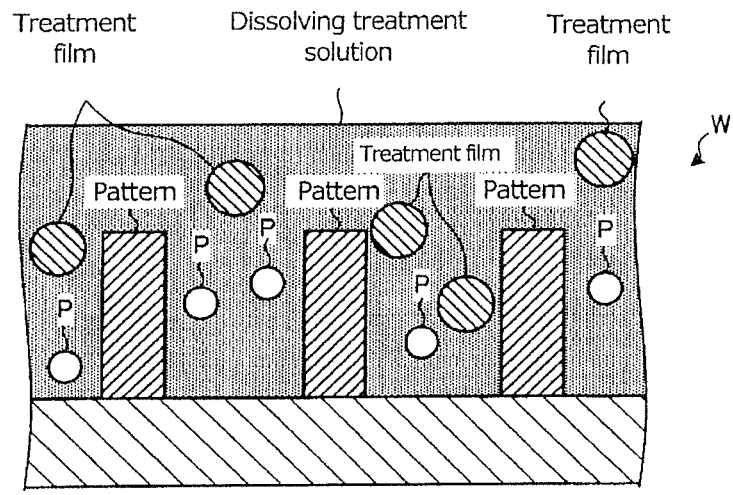
FIG. 1D
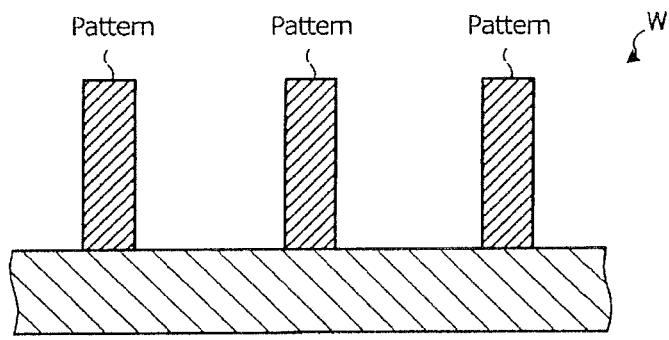
FIG. 1E
|  | | Substrate | |
|---|---|---|---|
|  | | Bare silicon wafer | SiN wafer |
| Chemicals | Top coat solution | Good | Poor |
|  | Film-forming treatment solution | Good | Good |
FIG. 2

US 10,792,711 B2

SUBSTRATE PROCESSING SYSTEM, SUBSTRATE CLEANING METHOD, AND RECORDING MEDIUM

CROSS REFERENCE TO RELATED APPLICATIONS

This application is a continuation of U.S. application Ser. No. 14/809,387, filed Jul. 27, 2015, and claims the benefit under 35 USC § 119(a)-(d) of Japanese Patent Application No. 2014-157196, filed Jul. 31, 2014, and Japanese Patent Application No. 2015-092918, filed Apr. 30, 2015, the entireties of which are incorporated herein by reference.

FIELD OF THE INVENTION

Exemplary embodiments of the present disclosure relate to a substrate processing system, a substrate cleaning method, and a recording medium.

BACKGROUND OF THE INVENTION

From the past, a substrate cleaning device has been known with which particles attached to a substrate such as a silicon wafer and a compound semiconductor wafer are removed. For example, in Japanese Patent Laid-Open Publication No. 2014-123704, a substrate cleaning method is disclosed wherein a treatment film is formed on surface of a substrate by using a topcoat solution, and then by removing this treatment film, particles on the substrate are removed together with the treatment film.

SUMMARY OF THE INVENTION

However, by the method described in Japanese Patent Laid-Open Publication No. 2014-123704, for example, when a substrate having a underlayer film is processed, the treatment film cannot be fully removed depending on the substrate to be treated, so that there have been a possibility that a high removing performance of the particles cannot be obtained.

An exemplary embodiment has an object to provide a substrate processing system, a substrate cleaning method, and a recording medium, with which a high removing performance of the particles can be obtained.

A substrate processing system according to the exemplary embodiment comprises a holding unit and a removing solution supply unit. The holding unit holds a substrate that has a treatment film formed thereon, wherein the treatment film contains an organic solvent and a fluorine-containing polymer that is soluble in the organic solvent. The removing solution supply unit supplies to the treatment film formed on the substrate, a removing solution capable of removing the treatment film.

According to the exemplary embodiment, a high removing performance of the particles can be obtained

BRIEF DESCRIPTION OF THE DRAWINGS

FIG. 1D is an explanatory drawing of the substrate cleaning method according to the exemplary embodiment of the present disclosure.

FIG. 1E is an explanatory drawing of the substrate cleaning method according to the exemplary embodiment of the present disclosure.

FIG. 2 shows evaluation results with regard to the removabilities of a conventional topcoat solution and of the film-forming treatment solution from the substrate according to the exemplary embodiment of the present disclosure.

DETAILED DESCRIPTION OF THE INVENTION

Hereunder, by referring to the attached drawings, exemplary embodiments of the substrate processing system, the substrate cleaning method, and the recoding medium disclosed by the present application will be explained in detail. Meanwhile, the present invention is not restricted by the exemplary embodiments shown below.

Substrate Cleaning Method

First of all, contents of the substrate cleaning method according to the explanatory embodiment of the present disclosure will be explained by using FIG. 1A to FIG. 1E. FIG. 1A to FIG. 1E are explanatory drawings of the substrate cleaning method according to the exemplary embodiment of the present disclosure.

Figure 1A:
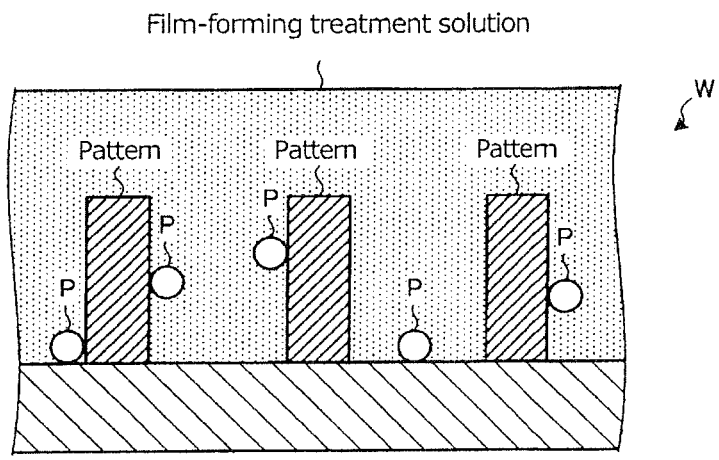
FIG. 1A is an explanatory drawing of the substrate cleaning method according to the exemplary embodiment of the present disclosure.

As shown in FIG. 1A, in the substrate cleaning method according to the explanatory embodiment of the present disclosure, a "film-forming treatment solution" is supplied to a pattern-formed surface of a substrate such as a silicon wafer and a compound semiconductor wafer (hereinafter, also referred to as "wafer W").

The "film-forming treatment solution" of the exemplary embodiment of the present disclosure is a composition for substrate cleaning which comprises an organic solvent and a fluorine-containing polymer that is soluble in the organic solvent (preferably, a polymer having a partial structure represented by the formula (1) discussed later). By using the film-forming treatment solution, a high removing performance of particles can be obtained regardless of the kind of the underlayer film. Meanwhile, the polymer is not limited to the one having the partial structure represented by the formula (1) discussed later, whereby if it contains a fluorine atom, the same effect as mentioned above can be obtained.

The film-forming treatment solution supplied to the pattern-formed surface of the wafer W becomes a treatment film by solidification or curing of the film-forming treatment solution. This results in a state in which the pattern formed on the wafer W and the particles P attached to the pattern are covered with the treatment film (see FIG. 1B). Meanwhile, the term "solidification" used herein means a solution becomes a solid; and the term "curing" means that molecules are connected with one another to become a polymer (for example, crosslinking and polymerization).

Figure 1B:
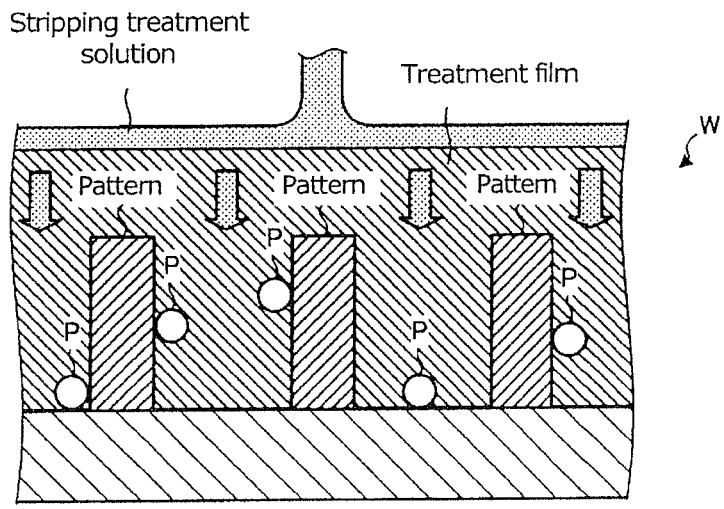
FIG. 1B is an explanatory drawing of the substrate cleaning method according to the exemplary embodiment of the present disclosure.
Figure 1C:
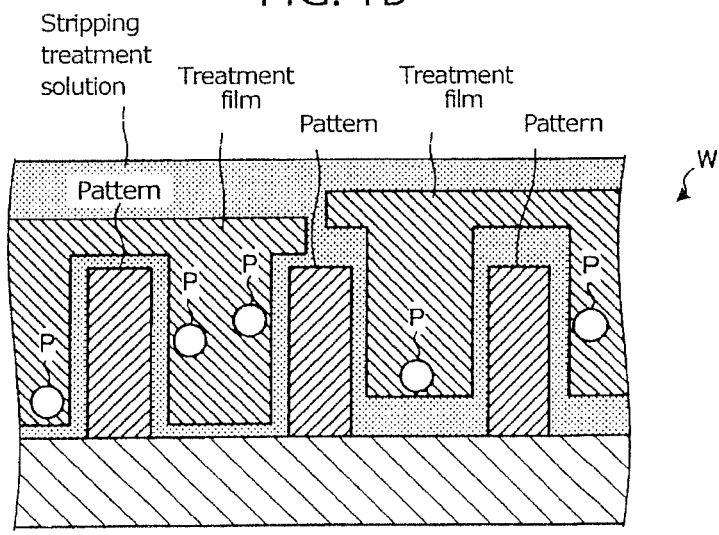
FIG. 1C is an explanatory drawing of the substrate cleaning method according to the exemplary embodiment of the present disclosure.

Next, as shown in FIG. 1B, a stripping treatment solution is supplied to the treatment film formed on the wafer W. The stripping treatment solution is a treatment solution for stripping the treatment film from the wafer W.

After being supplied to the treatment film, the stripping treatment solution penetrates into the treatment film to reach an interface between the treatment film and the wafer W. Because the stripping treatment solution penetrates to the interface between the treatment film and the wafer W, the treatment film is stripped in the state of "film" from the wafer W; and as a result, the particles P attached to the pattern-formed surface are stripped together with the treatment film from the wafer W (see FIG. 1C).

With this regard, for example, Japanese Patent Laid-Open Publication No. 2014-123704 discloses a substrate cleaning method, comprising forming a treatment film on a surface of a substrate by using a topcoat solution, and then removing particles on the substrate together with the treatment film by removing the treatment film. The topcoat solution is a protective film applied onto a surface of a resist film to inhibit penetration of an immersion liquid into this resist film.

In the substrate cleaning method according to the exemplary embodiment of the present disclosure, as the flow to remove the treatment film, firstly the explanation was made about the stripping of the treatment film formed on the substrate in the state of film; however, if the topcoat solution mentioned above is used, depending on the substrate having a underlayer film, such as for example, SiN (silicon nitride) and TiN (titanium nitride), sometimes the treatment film cannot be stripped fully, thereby leading to the insufficient removability of the treatment film from the substrate. In other words, depending on the substrate to be processed, the treatment film cannot be fully removed, so that there has been a possibility that the removing performance of the particles cannot be fully expressed.

Therefore, in the substrate cleaning method according to the exemplary embodiment of the present disclosure, the composition for substrate cleaning mentioned before is used as the film-forming treatment solution. The film-forming treatment solution as mentioned above has a higher removability of the treatment film from the substrate as compared with the conventional topcoat film; and thus, a high removing performance of the particles can be obtained even in the case that the substrate having a underlayer film such as the SiN film and the TiN film is a target to be processed.

Here, the evaluation results with regard to the removabilities of the conventional topcoat solution and of the film-forming treatment solution according to the exemplary embodiment of the present disclosure from the substrate will be explained by referring to FIG. 2. FIG. 2 shows the evaluation results with regard to the removabilities of the conventional topcoat solution and of the film-forming treatment solution according to the exemplary embodiment of the present disclosure from the substrate.

In FIG. 2, the study was done with regard to the case that after each of the treatment film is formed with the topcoat solution and with the film-forming treatment solution on a bare silicon wafer and on a SiN wafer (a substrate having a SiN film), DIW, i.e., pure water with a normal temperature (about 23 to 25 degrees) is supplied as the stripping treatment solution; and the evaluation results of the removability of each of the treatment films from the substrate are shown. In FIG. 2, "Good" means that the removability of the treatment film from the substrate is 90% or more, and "Poor" means that the removability of the same is 10% or less.

As shown in FIG. 2, it can be seen that the treatment film formed with the conventional topcoat solution can be stripped from the substrate very well as far as the bare silicon wafer is a target to be processed; however, when the SiN wafer is used as a target to be processed, the treatment film cannot be sufficiently stripped from the substrate, which indicates that the removability thereof is deteriorated.

On the other hand, it can be seen that the treatment film of the film-forming treatment solution according to the exemplary embodiment of the present disclosure can be stripped very well from the substrate in both cases that the bare silicon wafer and the SiN wafer are targets to be processed so that high removability can be obtained.

As shown above, in the substrate cleaning method according to the exemplary embodiment of the present disclosure, by using the film-forming treatment solution, the removability against the substrate having the underlayer film such as the SiN film can be enhanced as compared with the conventional topcoat solution. Therefore, according to the substrate cleaning method of the exemplary embodiment of the present disclosure, a higher removing performance of the particles as compared with the topcoat solution can be obtained in various substrates. Meanwhile, specific composition etc. of the film-forming treatment solution will be discussed later.

Subsequently, as shown in FIG. 1D, to the treatment film stripped from the wafer W, a dissolving treatment solution capable of dissolving the treatment film is supplied. By so doing, the treatment film is dissolved so that the particles P incorporated into the treatment film becomes in the state of floating in the dissolving treatment solution. Thereafter, by washing out the dissolving treatment solution and the dissolved treatment film with pure water, etc., the particles P can be removed from the surface of the wafer W (see FIG. 1E).

As discussed above, in the substrate cleaning method according to the exemplary embodiment of the present disclosure, the treatment film formed on the wafer W is stripped from the wafer W in the state of the "film", so that the particles P attached to the pattern etc. can be removed together with the treatment film from the wafer W.

Therefore, according to the substrate cleaning method of the exemplary embodiment of the present disclosure, the particle removal is effected by utilizing the formation and removal of the treatment film; and thus, erosion of the underlayer film due to an etching action etc. can be suppressed.

In addition, according to the substrate cleaning method of the exemplary embodiment of the present disclosure, the particles P can be removed by a weaker force as compared with the conventional substrate cleaning method utilizing a physical force; and thus, the pattern fall can be suppressed, too.

Moreover, according to the substrate cleaning method of the exemplary embodiment of the present disclosure, the particles P whose particle diameters are small can be removed readily; these particles having been difficult to be removed by the conventional substrate cleaning method utilizing a physical force.

Meanwhile, in the substrate cleaning method according to the exemplary embodiment of the present disclosure, the treatment film is entirely removed without performing a patterning exposure after it is formed on the wafer W. Therefore, the wafer W after cleaning becomes to the state before application of the film-forming treatment solution, namely, to the state in which the pattern-formed surface is exposed.

Composition for Substrate Cleaning

Next, the film-forming treatment solution mentioned above will be specifically explained. Meanwhile, hereunder, the film-forming treatment solution is also referred to as a "composition for substrate cleaning".

The composition for substrate cleaning contains (A) an organic solvent and (B) a fluorine-containing polymer that is soluble in the organic solvent. It is preferable that the polymer (B) has a partial structure represented by the following formula (1). It is presumed that because the polymer (B) has a partial structure represented by the following formula (1) as a polar group, not only the composition for substrate cleaning can express suitable wetting and extending properties to the substrate surface but also the treatment film formed can have an affinity to the stripping treatment solution as well as a suitable dissolution rate; and thus, the treatment film can be removed promptly in the state in which the particles on the substrate surface are enclosed therein, so that a high removal efficiency can be realized.

[Formula (1)]

(1)

In the formula (1), $R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1 to 8 carbon atoms, and the symbol * shows a bonding site with another atom constituting the polymer.

The composition for substrate cleaning may further contain a low-molecular organic acid (hereinafter, also referred to as an "organic acid (C)"). Here, the low-molecular organic acid means an acid containing one or more carbon atoms in one molecule thereof and not having a repeating unit formed by a polymerization reaction or a condensation reaction. The molecular weight thereof is not restricted; however, it is generally in the range of 40 or more and 2000 or less. When the composition for substrate cleaning contains the organic acid (C), the composition for substrate cleaning can be removed more readily from the surface of the substrate. For example, when the treatment film is formed on a surface of a silicon nitride substrate having a SiN film as an underlayer film or on a surface of a titanium nitride substrate having a TiN film as an underlayer film, removal of the treatment film sometimes takes more time than when the treatment film is formed on a surface of a silicon substrate. By adding the organic acid (C), the time necessary to remove the treatment film can be shortened. The reason for this is not clear yet, but one possible reason might be presumed as following; for example, the treatment film formed on the surface of the substrate becomes to the state in which the organic acid (C) is dispersed in the polymer (B), thereby decreasing the strength of the treatment film to a proper strength. As a result of this, it is presumed that the treatment film can be removed more readily from the substrate, even if the substrate has a strong interaction with the polymer (B) such as, for example, a silicon nitride substrate.

In addition, besides the components (A) to (C), the composition for substrate cleaning may contain an arbitrary component so far as the effects of the present invention are not damaged.

Hereunder, each of the components will be explained.

(A) Organic Solvent

The organic solvent (A) is a component capable of dissolving the polymer (B). When the organic acid (C) is added, it is preferable that the organic solvent (A) can dissolve the organic acid (C).

Illustrative examples of the organic solvent (A) include organic solvents such as an alcohol solvent, an ether solvent, a ketone solvent, an amide solvent, an ester solvent, and a hydrocarbon solvent. The composition for substrate cleaning may contain a solvent other than the organic solvent (A). Illustrative examples of the solvent other than the organic solvent (A) include water.

Illustrative examples of the alcohol solvent include monovalent alcohols having 1 to 18 carbon atoms such as ethanol, isopropyl alcohol, amyl alcohol, 4-methyl-2-pentanol, cyclohexanol, 3,3,5-trimethylcyclohexanol, furfuryl alcohol, benzyl alcohol, and diacetone alcohol; divalent alcohols having 2 to 12 carbon atoms such as ethylene glycol, propylene glycol, diethylene glycol, dipropylene glycol, triethylene glycol, and tripropylene glycol; and partial ethers of them.

Illustrative examples of the ether solvent include dialkyl ether solvents such as diethyl ether, dipropyl ether, dibutyl ether, and diisoamyl ether; cyclic ether solvents such as tetrahydrofuran and tetrahydropyran; and aromatic ring-containing ether solvents such as diphenyl ether and anisole.

Illustrative examples of the ketone solvent include chain ketone solvents such as acetone, methyl ethyl ketone, methyl-n-propyl ketone, methyl-n-butyl ketone, diethyl ketone, methyl-iso-butyl ketone, 2-heptanone, ethyl-n-butyl ketone, methyl-n-hexyl ketone, di-isobutyl ketone, and trimethyl nonanone; cyclic ketone solvents such as cyclopentanone, cyclohexanone, cycloheptanone, cyclooctanone, and methyl cyclohexanone; 2,4-pentanedione; acetonyl acetone; and acetophenone.

Illustrative examples of the amide solvent include cyclic amide solvents such as N,N'-dimethylimidazolidinone and N-methylpyrrolidone; and chain amide solvents such as N-methylformamide, N,N-dimethylformamide, N,N-diethylformamide, acetamide, N-methylacetamide, N,N-dimethylacetamide, and N-methylpropionamide.

Illustrative examples of the ester solvent include monovalent alcohol carboxylate solvents such as ethyl acetate, butyl acetate, benzyl acetate, cyclohexyl acetate, and ethyl lactate; polyvalent alcohol partial ether carboxylate solvents such as a monocarboxylate of an alkylene glycol monoalkyl ether and a monocarboxylate of a dialkylene glycol monoalkyl ether; cyclic ester solvents such as butyrolactone; carbonate solvents such as diethyl carbonate; and polycarboxylate alkyl ester solvents such as diethyl oxalate and diethyl phthalate.

Illustrative examples of the hydrocarbon solvent include aliphatic hydrocarbon solvents such as n-pentane, iso-pentane, n-hexane, iso-hexane, n-heptane, iso-heptane, 2,2,4-trimethylpentane, n-octane, iso-octane, cyclohexane, and methylcyclohexane; and aromatic hydrocarbon solvents such as benzene, toluene, xylene, mesitylene, ethylbenzene, trimethylbenzene, methylethylbenzene, n-propylbenzene, iso-propylbenzene, diethybenzene, iso-butylbenzene, triethylbenzene, di-iso-propylbenzene, and n-amylnaphthalene.

As to the organic solvent (A), an alcohol solvent, an ether solvent and an ester solvent are preferable; a monoalcohol solvent, a dialkyl ether solvent and a monovalent alcohol carboxylate solvent are more preferable; and 4-methyl-2-pentanol, diisoamyl ether, propylene glycol monoethyl ether, ethoxypropanol, and ethyl lactate are still more preferable.

The content rate of water to the total of the organic solvent (A) and the water is preferably 20% or less by mass, more preferably 5% or less by mass, still more preferably 2% or less by mass, or particularly preferably 0% by mass. When the content rate of water to the total of the organic solvent (A) and the water is equal to or lower than the above-mentioned upper limit, the strength of the formed treatment film can be lowered to a proper strength, so that the removing performance of the particles can be enhanced.

The lower limit of the content of the organic solvent (A) in the composition for substrate cleaning is preferably 50% by mass, more preferably 60% by mass, or still more preferably 70% by mass. The upper limit of the content is preferably 99.9% by mass, more preferably 99% by mass, or still more preferably 95% by mass. When the content of the organic solvent (A) is between the upper limit and the lower limit as mentioned above, the performance of the composition for substrate cleaning in removing the particles attached to the silicon nitride substrate can be enhanced furthermore. The composition for substrate cleaning may contain one, or two or more of the organic solvent (A).

(B) Polymer

The polymer (B) is a fluorine-containing polymer that is soluble in the organic solvent (A). It is preferable that the polymer (B) has a partial structure represented by the following formula (1):

wherein $R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1 to 8 carbon atoms; and the symbol * shows a bonding site with another atom constituting the polymer.

Illustrative examples of the alkyl group represented by $R^1$ or $R^2$, or an alkyl group in the fluorinated alkyl group represented by $R^1$ or $R^2$ (i.e., an alkyl before being substituted with a fluorine atom) include linear or branched alkyl groups having 1 to 8 carbon atoms such as methyl, ethyl, n-propyl, isopropyl, n-butyl, isobutyl, s-butyl, t-butyl, pentyl, hexyl, heptyl and octyl groups; cycloalkyl groups having 3 to 8 carbon atoms such as cyclopropyl, cyclobutyl, cyclopentyl, cyclohexyl, cycloheptyl and cyclooctyl groups; and alkyl groups having a linear or branched moiety and a cyclic moiety and having 4 to 8 carbon atoms such as cyclopentylmethyl, cyclopentylethyl, cyclopentylpropyl, cyclohexylmethyl, and cyclohexylethyl groups.

In the fluorinated alkyl group represented by $R^1$ or $R^2$, the hydrogen atoms of the alkyl group having 1 to 8 carbon atoms may be partially substituted with a fluorine atom(s), or may be wholly substituted with fluorine atoms. It is preferable that the fluorinated alkyl group represented by $R^1$ or $R^2$ is a trifluoromethyl group.

The type of the polymer (B) is not particularly restricted as long as the polymer (B) has a fluorine atom and is soluble in the organic solvent (A); however, in view of easiness in the synthesis thereof and a high removability, a cyclic polyolefin having a fluorine atom and a poly(meth)acrylate having a fluorine atom are preferable. When a poly(meth)acrylate having a fluorine atom is used, a preferable polymer thereof includes the one having a fluorine-containing structure unit represented by the following formula (2) (hereinafter, also referred to as "structure unit (I)").

[Formula (2)]

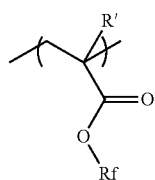

(2)

In the formula (2), R' represents a hydrogen atom, a fluorine atom, a methyl group, or a trifluoromethyl group, and Rf represents a group represented by the formula (1) or a group having a partial structure represented by the formula (1).

As to R' shown above, in view of the copolymerization ability of the monomer to give the structure unit (I), a hydrogen atom and a methyl group are preferable, though a methyl group is more preferable.

Illustrative examples of the group represented by Rf which has a partial structure represented by the formula (1) include a hydrocarbon group substituted with the group represented by the formula (1). The hydrocarbon group may be substituted with two or more of the groups represented by the formula (1). Illustrative examples of a preferable group represented by the formula (1) include a hydroxy di(trifluoromethyl)methyl group.

The hydrocarbon group may be a chain hydrocarbon group, an alicyclic hydrocarbon group, an aromatic hydrocarbon group, or a combination thereof. The chain hydrocarbon group may be linear or branched.

Illustrative examples of the chain hydrocarbon group include linear or branched alkyl groups such as methyl, ethyl, n-propyl, isopropyl, n-butyl, isobutyl, s-butyl, t-butyl, pentyl, hexyl, heptyl, octyl, nonyl and decyl groups. Illustrative examples of the alicyclic hydrocarbon group include cycloalkyl groups such as cyclopropyl, cyclobutyl, cyclopentyl, cyclohexyl, cycloheptyl, cyclooctyl, cyclononyl and cyclodecyl groups; and bridged alicyclic hydrocarbon groups resulting from removal of one hydrogen atom from norbornane, norbornene, tricyclodecane, tetracyclododecane, adamantane or the like. Illustrative examples of the aromatic hydrocarbon group include phenyl, tolyl, xylyl, biphenyl, indenyl, naphtyl, dimethyl naphtyl, anthryl, phenanthryl, fluorenyl, pyrenyl, chrysenyl and naphthacenyl groups. Illustrative examples of a combination of the chain hydrocarbon group and the cyclic hydrocarbon group include cyclopentylmethyl, cyclopentylethyl, cyclopentylpropyl, cyclohexylmethyl, cyclohexylethyl, cyclohexylpropyl, tolyl, xylyl, dimethyl naphty, benzyl, naphthylmethyl, indenylmethyl and biphenylmethyl groups. The carbon number of the linear or branched alkyl group is, for example, 1 to 20, or preferably 1 to 10. The carbon number of the cycloalkyl group is, for example, 3 to 22, or preferably 3 to 12. The carbon number of the alkyl group having a linear or branched moiety and a cyclic moiety is, for example, 4 to 23, or preferably 4 to 13.

Illustrative examples of a preferable group represented by Rf include hydroxy-substituted fluorinated chain hydrocarbon groups such as a hydroxy di(trifluoromethyl)methyl group, a hydroxy di(trifluoromethyl)ethyl group, a hydroxy di(trifluoromethyl)propyl group, and a hydroxy di(trifluoromethyl)butyl group; hydroxy-substituted fluorinated alicyclic hydrocarbon groups such as a hydroxy di(trifluoromethyl)methyl cyclopentyl group and a hydroxy di(trifluoromethyl)methyl cyclohexyl group; and hydroxy-substituted fluorinated aromatic hydrocarbon groups such as a hydroxy di(trifluoromethyl)methyl phenyl group.

As to Rf, among them, the hydroxy-substituted fluorinated chain hydrocarbon groups (i.e., alkyl groups substituted with the group represented by formula (1)) are preferable; and the hydroxy di(trifluoromethyl)butyl group is more preferable.

The content of the structure unit (I) is, relative to total structure units constituting the polymer (B), preferably in the range of 10 to 100% by mole, more preferably in the range of 50 to 100% by mole, still more preferably in the range of 90 to 100% by mole, or particularly preferably in the range of 95 to 100% by mole. When the content of the structure unit (I) is within the range mentioned above, the removability of the treatment film can be further enhanced.

The polymer (B) may further contain, as a structure unit (II), a structure unit containing a fluoroalkyl group, a structure unit containing a β-diketone structure, a structure unit containing a carboxy group, a structure unit containing a sulfo group, a structure unit containing a sulfonamide group, a structure unit derived from an alkyl (meth)acrylate, a structure unit containing a monocyclic or polycyclic lactone skeleton, a structure unit containing a hydroxy group, a structure unit containing an aromatic ring, or a structure unit containing an acid-dissociable group. When the structure unit (II) contains a fluoroalkyl group, the content of the structure unit (II) in the polymer (B) is preferably 50% or less by mole, more preferably less than 30% by mole, or particularly preferably less than 10% by mole. When the content of the structure unit (II) containing the fluoroalkyl group is more than 50% by mole, especially when the content of the structure unit (II) containing the fluoroalkyl group is more than 50% by mole and an organic acid (C) discussed later is not added, the removability of the treatment film is prone to be deteriorated.

The acid dissociation constant of the polymer (B) is preferably less than the acid dissociation constant of the organic acid (C) that will be discussed later. When the acid dissociation constant of the polymer (B) is less than that of the organic acid (C), the removability of the treatment film from the substrate surface can be enhanced furthermore. The acid dissociation constants of the polymer (B) and the organic acid (C) can be determined by a heretofore known titration method. To evaluate the relative magnitude relation between the acid dissociation constants, the values may be obtained from the calculation by using a chemical calculation software as the more convenient method than the titration method. For example, they can be calculated by using the program provided by ChemAxon Ltd.

The lower limit of the content of the polymer (B) in the composition for substrate cleaning is preferably 0.1% by mass, more preferably 0.5% by mass, or still more preferably 1% by mass. The upper limit of the content is preferably 50% by mass, more preferably 30% by mass, or still more preferably 15% by mass. When the content is between the upper limit and the lower limit as mentioned above, the removability of the treatment film from the substrate surface can be enhanced furthermore.

The lower limit of the content of the polymer (B) relative to total solid components in the composition for substrate cleaning is preferably 30% by mass, more preferably 40% by mass, or still more preferably 50% by mass. The upper limit of the content is preferably 99% by mass, more preferably 98% by mass, or still more preferably 96% by mass.

(C) Organic Acid

The composition for substrate cleaning may further contain (C) an organic acid. When the organic acid (C) is added, the treatment film formed on the substrate surface can be removed more readily. Preferably, the organic acid (C) is not a polymer. Here, the phrase "not a polymer" means that it does not have a repeating unit. The upper limit of the molecular weight of the organic acid (C) is, for example, 500, preferably 400, or more preferably 300. The lower limit of the molecular weight of the organic acid (C) is, for example, 50, or preferably 55.

Illustrative examples of the organic acid (C) include monocarboxylic acids such as acetic acid, propionic acid, butyric acid, pentanoic acid, hexanoic acid, cyclohexane carboxylic acid, cyclohexylacetic acid, 1-adamantane carboxylic acid, benzoic acid, and phenylacetic acid; fluorine-containing monocarboxylic acids such as difluoroacetic acid, trifluoroacetic acid, pentafluoropropionic acid, heptafluorobutyric acid, fluorophenylacetic acid, and difluorobenzoic acid; heteroatom-containing monocarboxylic acids such as 10-hydroxydecanoic acid, thiolacetic acid, 5-oxohexanoic acid, 3-methoxy cyclohexane carboxylic acid, camphor carboxylic acid, dinitrobenzoic acid, and nitrophenylacetic acid; monocarboxylic acids such as double bond-containing monocarboxylic acids including (meth)acrylic acid, crotonic acid, and cinnamic acid; polycarboxylic acids such as oxalic acid, malonic acid, succinic acid, glutaric acid, adipic acid, dodecane dicarboxylic acid, propane tricarboxylic acid, butane tetracarboxylic acid, hexafluoroglutaric acid, cyclohexane hexacarboxylic acid, and 1,4-naphthalene dicarboxylic acid; and partial esters of the polycarboxylic acids mentioned above.

The lower limit of the solubility of the organic acid (C) in water at 25° C. is preferably 5% by mass, more preferably 7% by mass, or still more preferably 10% by mass. The upper limit of the solubility is preferably 50% by mass, more preferably 40% by mass, or still more preferably 30% by mass. When the solubility is between the upper limit and the lower limit as mentioned above, the removability of the formed treatment film can be enhanced furthermore.

The organic acid (C) is preferably in the solid state at 25° C. If the organic acid (C) is in the solid state at 25° C., it is considered that the organic acid (C) in the solid state is precipitated in the treatment film formed from the composition for substrate cleaning, so that the removability thereof can be enhanced furthermore.

In order for the treatment film to be removed more readily, the organic acid (C) is preferably polycarboxylic acids, or more preferably oxalic acid, malic acid, and citric acid.

The lower limit of the content of the organic acid (C) in the composition for substrate cleaning is preferably 0.01% by mass, more preferably 0.05% by mass, or still more preferably 0.1% by mass. The upper limit of the content is preferably 30% by mass, more preferably 20% by mass, or still more preferably 10% by mass.

The lower limit of the content of the organic acid (C) relative to the total solid components in the composition for substrate cleaning is preferably 0.5% by mass, more preferably 1% by mass, or still more preferably 3% by mass. The upper limit of the content is preferably 30% by mass, more preferably 20% by mass, or still more preferably 10% by mass.

When the content of the organic acid (C) is between the upper limit and the lower limit as mentioned above, the treatment film can be removed more readily.

Arbitrary Components

The composition for substrate cleaning may contain an arbitrary component other than the components (A) to (C) mentioned above. Illustrative examples of the arbitrary component include surfactant, etc.

Illustrative examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate.

The content of the surfactant mentioned above is usually 2% or less by mass, or preferably 1% or less by mass.

Structure of the Substrate Cleaning System

Figure 3:
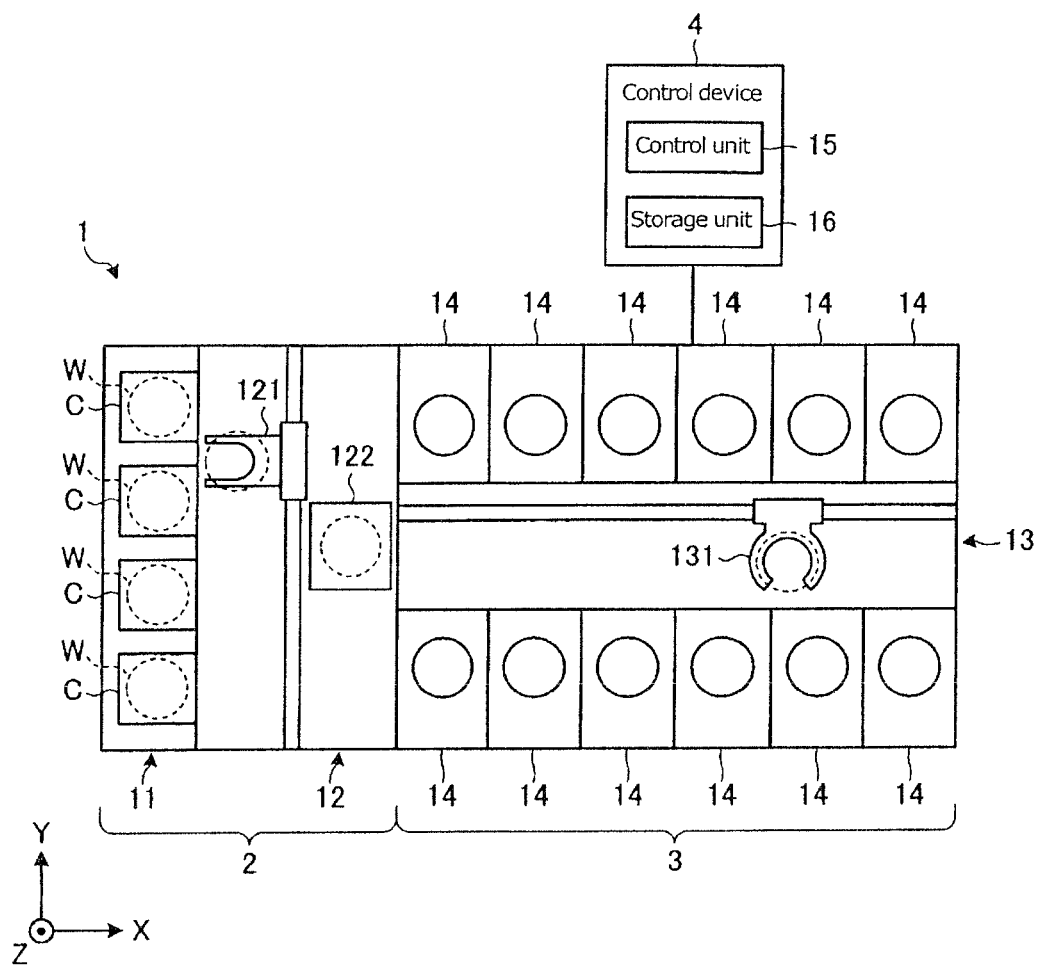
FIG. 3 is a schematic diagram illustrating a structure of the substrate cleaning system according to the exemplary embodiment of the present disclosure.

Next, the structure of the substrate cleaning system according to the exemplary embodiment of the present disclosure will be explained by using FIG. 3. FIG. 3 is a schematic diagram illustrating the structure of the substrate cleaning system according to the exemplary embodiment of the present disclosure. In the following, in order to clarify positional relationships, the X-axis, Y-axis, and Z-axis which are orthogonal to each other will be defined. The positive Z-axis direction will be regarded as a vertically upward direction.

As shown in FIG. 3, a substrate cleaning system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of transfer vessels (hereinafter, referred to as "carriers C") are placed to accommodate a plurality of wafers W horizontally.

The transfer section 12 is provided adjacent to the carrier placing section 11. Inside the transfer section 12, a substrate transfer device 121 and a delivery unit 122 are provided.

The substrate transfer device 121 is provided with a wafer holding mechanism configured to hold the wafer W. Further, the substrate transfer device 121 is movable horizontally and vertically and pivotable around a vertical axis, and transfers the wafer W between the carrier C and the delivery unit 122 by using the wafer holding mechanism.

The processing station 3 is provided adjacent to the transfer section 12. The processing station 3 is provided with a transfer section 13 and a plurality of substrate cleaning devices 14. The plurality of substrate cleaning devices 14 are arranged at both sides of the transfer section 13.

The transfer section 13 is provided with a substrate transfer device 131 therein. The substrate transfer device 131 is provided with a wafer holding mechanism configured to hold the wafer W. Further, the substrate transfer device 131 is movable horizontally and vertically and pivotable around a vertical axis, and transfers the wafer W between the delivery unit 122 and the substrate cleaning devices 14 by using the wafer holding mechanism.

The substrate cleaning device 14 is a device configured to perform the substrate cleaning process based on the substrate cleaning method mentioned above. The specific structure of the substrate cleaning device 14 will be discussed later.

Further, the substrate cleaning system 1 is provided with a control device 4. The control device 4 is a device configured to control the operation of the substrate cleaning system 1. The control device 4 is, for example, a computer, and includes a control unit 15 and a storage unit 16. The storage unit 16 stores a program that controls various processes such as the substrate cleaning process. The control unit 15 controls the operation of the substrate cleaning system 1 by reading and executing the program stored in the storage unit 16. The control unit 15 comprises, for example, CPU (Central Processing Unit) and MPU (Micro Processor Unit); and the storage unit 16 comprises, for example, ROM (Read Only Memory) and RAM (Random Access Memory).

Meanwhile, the program may be recorded in a computer-readable recording medium, and installed from the recoding medium to the storage unit 16 of the control device 4. The computer-readable recording medium may be, for example, a hard disk (HD), a flexible disk (FD), a compact disc (CD), a magnet optical disc (MO), or a memory card.

In the substrate cleaning system 1 configured as described above, the substrate transfer device 121 of the carry-in/out station 2 first takes out a wafer W from the carrier C, and then places the taken wafer W on the delivery unit 122. The wafer W placed on the delivery unit 122 is taken out from the delivery unit 122 by the substrate transfer device 131 of the processing station 3 and carried into the substrate cleaning device 14; and then, the substrate cleaning process is performed by the substrate cleaning device 14. The wafer W after being cleaned is carried out from the substrate cleaning device 14 by the substrate transfer device 131, and then placed on the delivery unit 122, and then returned to the carrier C by the substrate transfer device 121.

Structure of the Substrate Cleaning Device

Figure 4:
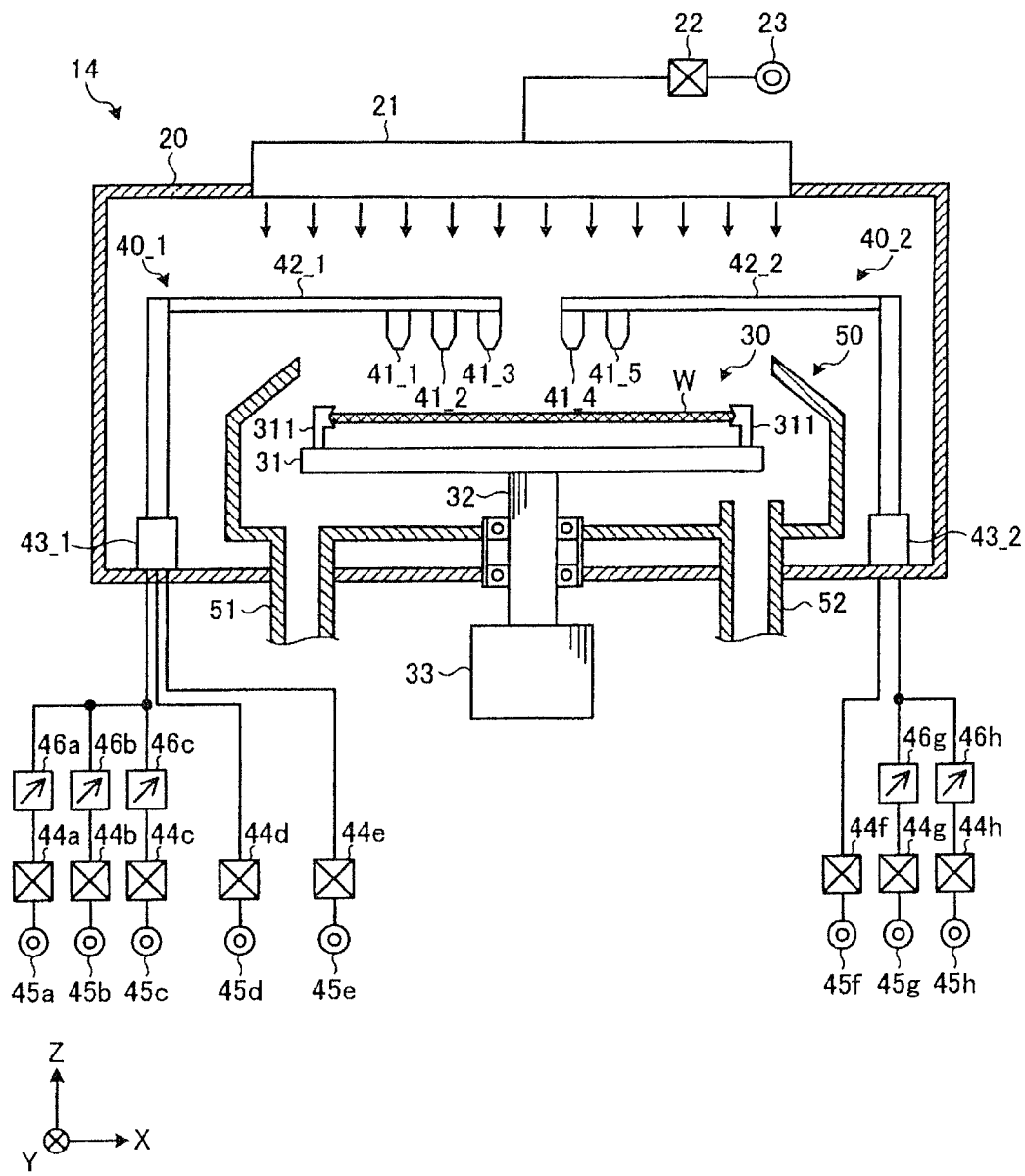
FIG. 4 is a schematic diagram illustrating a structure of the substrate cleaning device according to the exemplary embodiment of the present disclosure.

Next, the structure of the substrate cleaning device 14 will be explained by referring to FIG. 4. FIG. 4 is a schematic diagram illustrating the structure of the substrate cleaning device 14 according to the exemplary embodiment of the present disclosure.

As shown in FIG. 4, the substrate cleaning device 14 is provided with a chamber 20, a substrate holding mechanism 30, a solution supply unit 40, and a recovery cup 50.

The chamber 20 accommodates the substrate holding mechanism 30, the solution supply unit 40, and the recovery cup 50. On the ceiling of the chamber 20, a FFU (Fan Filter Unit) 21 is provided. The FFU 21 forms a downflow in the chamber 20.

The FFU 21 is connected to a downflow gas source 23 via a valve 22. The FFU 21 discharges a downflow gas (for example, a dry air) supplied from the downflow gas source 23 into the chamber 20.

The substrate holding mechanism 30 is provided with a rotation holding unit 31, a support unit 32, and a driving unit 33. The rotation holding unit 31 is arranged in an almost central part of the chamber 20. Above the rotation holding unit 31 is arranged a holding member 311 configured to hold the wafer W from the side thereof. The wafer W is held horizontally by the holding member 311 above the rotation holding unit 31 with a small space from it.

The support unit 32 is a member extended vertically whose base end portion is held rotatably by the driving unit 33 while holding the rotation holding unit 31 horizontally in its tip end portion. The driving unit 33 rotates the support unit 32 around the vertical axis.

By rotating the support unit 32 by using the driving unit 33, the substrate holding mechanism 30 rotates the rotation holding unit 31 supported by the support unit 32, thereby rotating the wafer W held on the rotation holding unit 31.

A solution supply unit 40_1 supplies various treatment solutions to the wafer W held on the substrate holding mechanism 30. The solution supply unit 40_1 is provided with nozzles 41_1 to 41_3, an arm 42_1 to hold the nozzles 41_1 to 41_3 horizontally, and a pivoting, raising and lowering mechanism 43_1 to pivot, raise and lower the arm 42_1.

The nozzle 41_1 is connected to a DIW source 45a via a flow rate controller 46a and a valve 44a, to an alkaline aqueous solution source 45b via a flow rate controller 46b and a valve 44b, and to an organic solvent source 45c via a flow rate controller 46c and a valve 44c.

Through the nozzle 41_1 is discharged DIW supplied from the DIW source 45a, the alkaline aqueous solution supplied from the alkaline aqueous solution source 45b, or the organic solvent supplied from the organic solvent source 45c. Further, for example, by opening the valve 44a and valve 44b, a mixed solution of DIW and the alkaline aqueous solution, namely, a diluted alkaline aqueous solution is discharged from the nozzle 41_1. Also, for example, by opening the valve 44a and valve 44c, a mixed solution of DIW and the organic solvent, namely, a diluted organic solvent is discharged from the nozzle 41_1. These mixing ratios are controlled by the control unit 15 thereby controlling the flow rate controllers 46a to 46c.

DIW is one example of the stripping treatment solution capable of stripping the treatment film from the wafer W. The alkaline aqueous solution is one example of the dissolving treatment solution capable of dissolving the treatment film. The alkaline aqueous solution is, for example, an alkaline developing solution. As to the alkaline developing solution, any solution will do so long as it contains at least one of, for example, an aqueous ammonia solution, a quaternary ammonium hydroxide solution such as tetramethyl ammonium hydroxide (TMAH), and an aqueous choline solution.

The organic solvent is another example of the dissolving treatment solution capable of dissolving the treatment film. Illustrative examples of the organic solvent to be used includes a thinner, IPA (isopropyl alcohol), MIBC (4-methyl-2-pentanol), toluene, acetate esters, alcohols, and glycols (propylene glycol monomethyl ether).

A nozzle 41_2 is connected to a DIW source 45d via a valve 44d to discharge DIW supplied from the DIW source 45d. DIW discharged from the nozzle 41_2 is one example of the rinsing treatment solution used in the rinsing process as discussed later.

A nozzle 41_3 is connected to an IPA source 45e via a valve 44e to discharge IPA supplied from the IPA source 45e. IPA is one example of the drying solvent used in the drying process as discussed later.

A solution supply unit 40_2 is provided with nozzles 41_4 and 41_5, an arm 42_2 to support the nozzles 41_4 and 41_5 horizontally, and a pivoting, raising and lowering mechanism 43_2 to pivot, raise and lower the arm 42_2.

A nozzle 41_4 is connected to a pretreatment solution source 45f via a valve 44f to discharge a pretreatment solution supplied from the pretreatment solution source 45f. Illustrative examples of the pretreatment solution include the organic solvent (A), a solvent other than the organic solvent (A), and a mixed solution of the organic solvent (A) and the solvent other than the organic solvent (A) (e.g., a mixed solution of all kinds of solvents contained in the film-forming treatment solution), each of which is contained in the film-forming treatment solution. In order that the film-forming treatment solution may be spread readily on the wafer W, the pretreatment solvent is supplied to the wafer W to which the film-forming treatment solution is not supplied yet. Further, the pretreatment solution may be, for example, an ozone water. The ozone water is used for a hydrophilization process to make the surface of the wafer W hydrophilic.

Here, the structure is employed wherein the substrate cleaning device 14 is provided with one 41_4 nozzle as the nozzle that discharges the pretreatment solution; alternatively, however, the substrate cleaning device 14 may be provided with both a nozzle that discharges the pretreatment solution and a nozzle that discharges the hydrophilizing treatment solution such as an ozone water.

A nozzle 41_5 is connected to an A+B source 45g via a flow rate controller 46g and a valve 44g, and also to a C source 45h via a flow rate controller 46h and a valve 44h.

From the A+B source 45g, a mixed solution of the organic solvent (A) and the polymer (B) is supplied. When the film-forming treatment solution containing a solvent other than the organic solvent (A) is used, the mixed solution of the organic solvent (A) and the polymer (B) may contain the solvent other than the organic solvent (A). From the C source 45h, the organic acid (C) is supplied. These are mixed in the flow path leading to the nozzle 41_5 to make the film-forming treatment solution, which is then discharged from the nozzle 41_5. The mixing ratio of the mixed solution of the organic solvent (A) and the polymer (B) with the organic acid (C) is regulated by the control unit 15 that controls the flow rate controllers 46g and 46h.

If the organic solvent (A), the polymer (B), and the organic acid (C) are mixed in advance, there is a possibility that the organic acid (C) is precipitated during the passage of time. Therefore, by making the structure wherein the mixed solution of the organic solvent (A) and the polymer (B) is mixed with the organic acid (C) just before they are discharged from the nozzle 41_5, precipitation of the organic acid (C) can be avoided.

Alternatively, by arranging a mixing tank in a midway in the flow path, the mixed solution of the organic solvent (A) and the polymer (B) may be mixed with the organic acid (C) in this mixing tank.

The nozzle 41_1, the arm 42_1, the pivoting, raising and lowering mechanism 43_1, the valves 44a to 44c, the DIW source 45a, the alkaline aqueous solution 45b, the organic solvent source 45c, and the flow rate controllers 46a to 46c are one example of the "removing solution supply unit". Among them, the nozzle 41_1, the arm 42_1, the pivoting, raising and lowering mechanism 43_1, the valves 44a, and the DIW source 45a are one example of the "stripping treatment solution supply unit"; and the nozzle 41_1, the arm 42_1, the pivoting, raising and lowering mechanism 43_1, the valves 44b (the valve 44c), and the alkaline aqueous solution source 45b (the organic solvent source 45c) are one example of the "dissolving treatment solution supply unit".

Further, the nozzle 41_1, the arm 42_1, the pivoting, raising and lowering mechanism 43_1, the valves 44b, and the alkaline aqueous solution source 45b are one example of the "alkaline aqueous solution supply unit"; and the nozzle 41_2, the arm 42_1, the pivoting, raising and lowering mechanism 43_1, the valves 44d, and the DIW source 45d are one example of the "rinsing solution supply unit".

Further, the nozzle 41_5, the arm 42_2, the pivoting, raising and lowering mechanism 43_2, the valves 44g and 44h, the A+B source 45g, the C source 45h, and the flow rate controllers 46g and 46h are one example of the "film-forming treatment solution supply unit".

Here, the structure is employed wherein the solution supply unit 40_1 and the solution supply unit 40_2 each is provided with a plurality of the nozzles 41_1 to 41_5; however, the solution supply unit 40_1 and the solution supply unit 40_2 each may contain one nozzle.

The recovery cup 50 is arranged such that it surrounds the rotation holding unit 31, so that the treatment solution scattered from the wafer W by rotation of the rotation holding unit 31 can be collected. On the bottom of the recovery cup 50 is formed a drain port 51; and the treatment solution collected by the recovery cup 50 is discharged to outside the substrate cleaning device 14 through the drain port 51. Further, in the bottom part of the recovery cup 50 is formed an exhaust port 52 configured to discharge the downflow gas supplied from the FFU 21 to outside the substrate cleaning device 14.

Specific Operation of the Substrate Cleaning System

Figure 5:
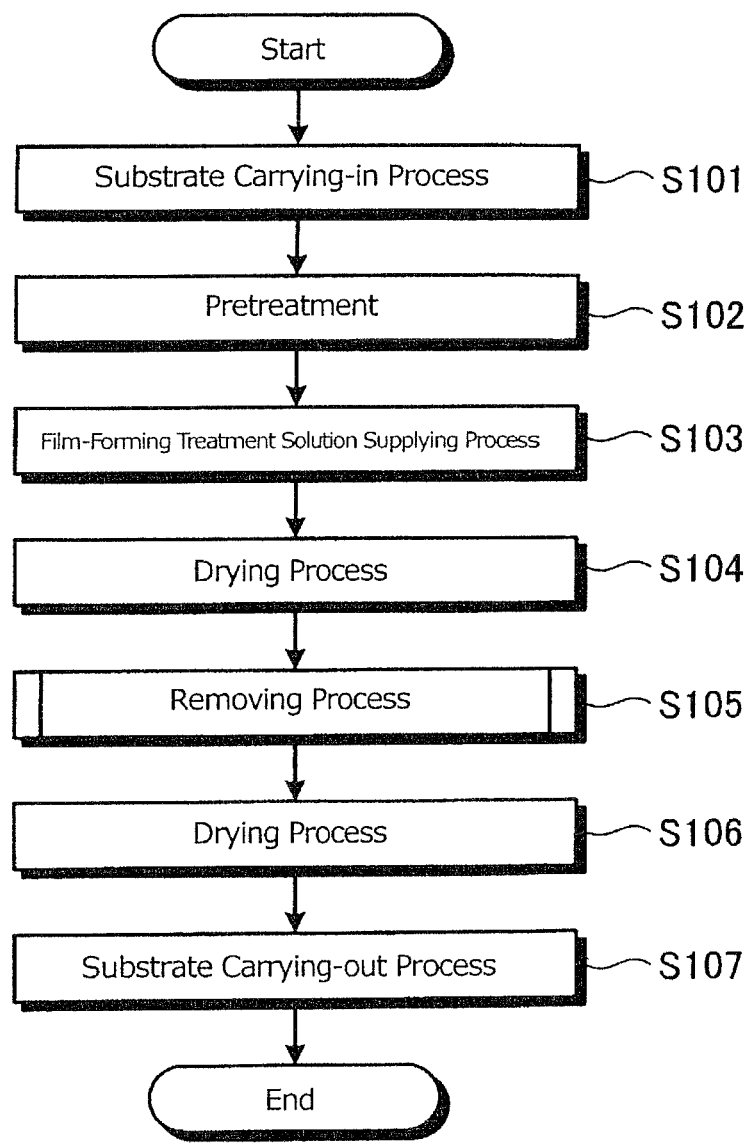
FIG. 5 is a flow chart showing a processing procedure of the substrate cleaning process performed by the substrate cleaning system according to the exemplary embodiment of the present disclosure.

Next, the specific operation of the substrate cleaning device 14 will be explained by referring to FIG. 5. FIG. 5 is a flow chart showing a processing procedure of the substrate cleaning process performed by the substrate cleaning system 1 according to the exemplary embodiment of the present disclosure. Each of the devices provided in the substrate cleaning system 1 performs each processing procedure shown in FIG. 5 by control of the control unit 15.

Hereunder, the explanation will be made as to the substrate cleaning process when any of the compositions of Examples 12 to 16 discussed later is used as the film-forming treatment solution.

As shown in FIG. 5, in the substrate cleaning device 14, at first, a substrate carrying-in process is performed (step S101). In this substrate carrying-in process, the wafer W which is carried into the chamber 20 by the substrate transfer device 131 (see FIG. 3) is held by the holding member 311 of the substrate holding mechanism 30. At this time, the wafer W is held to the holding member 311 in such a state that the pattern-formed surface may be faced upward. Thereafter, the rotation holding unit 31 rotates by the driving unit 33. By so doing, the wafer W rotates together with the rotation holding unit 31 while it is held horizontally to the rotation holding unit 31.

Subsequently, in the substrate cleaning device 14, pretreatment is performed (step S102). For example, if a pre-wetting process is performed as the pretreatment, the nozzle 41_4 of the solution supply unit 40_2 is placed above the center of the wafer W. Thereafter, by opening the valve 44f for a prescribed period of time, the pretreatment solution is supplied to the pattern-formed surface of the wafer W not formed with a resist. The pretreatment solvent supplied to the wafer W is spread on the pattern-formed surface of the wafer W by a centrifugal force generated by the rotation of the wafer W.

By spreading the pretreatment solvent having an affinity with the film-forming treatment solution on the wafer W in advance in the way as mentioned above, in the film-forming treatment solution supplying process discussed later (step S103), the film-forming treatment solution can be not only spread more readily on the surface of the wafer W but also penetrated into the space between the patterns. Accordingly, not only the use amount of the film-forming treatment solution can be reduced but also the particles P entered into the space between the patterns can be removed more surely. In addition, the processing time of the film-forming treatment solution supplying process can be made shorter.

Further, if the hydrophilization process is performed as the pretreatment, the nozzle 41_4 of the solution supply unit 40_2 is placed above the center of the wafer W. Thereafter, by opening the valve 44f for a prescribed period of time, the ozone water, which is used as the pretreatment solution, is supplied to the pattern-formed surface of the wafer W not formed with a resist. The ozone water supplied to the wafer W is spread on the pattern-formed surface of the wafer W by a centrifugal force generated by the rotation of the wafer W. In this way, the pattern-formed surface of the wafer W is hydrophilized.

By performing the hydrophilization process in the way as mentioned above, the stripping treatment solution can be penetrated readily to the hydrophilized interface of the wafer W (pattern-formed surface), so that the removability of the treatment film can be enhanced furthermore. Meanwhile, if the hydrophilizing process is performed as the pretreatment, in place of the ozone water, for example, an aqueous hydrogen peroxide solution may be used as the pretreatment solution. Meanwhile, performance of the pretreatment of the step S102 is not necessarily required.

Subsequently, in the substrate cleaning device 14, a film-forming treatment solution supplying process is performed (step S103). In this film-forming treatment solution supplying process, the nozzle 41_5 of the solution supply unit 40_2 is placed above the center of the wafer W. Thereafter, by opening the valves 44g and 44h for a prescribed period of time, each of a mixed solution of the organic solvent (A) with the polymer (B) and the organic acid (C) is supplied to the flow path to the nozzle 41_5. These are mixed in the flow path to become the film-forming treatment solution, which is then supplied to the pattern-formed surface of the wafer W not formed with a resist. In this way, the film-forming treatment solution is supplied onto the wafer W without intervened by the resist.

The film-forming treatment solution supplied to the wafer W is spread on the surface of the wafer W by a centrifugal force generated by the rotation of the wafer W. In this way, a liquid film of the film-forming treatment solution is formed on the pattern-formed surface of the wafer W. The film thickness of the treatment film to be formed is preferably in the range of 10 to 5,000 nm, or more preferably in the range of 20 to 500 nm.

Subsequently, in the substrate cleaning device 14, a drying process is performed (step S104). In this drying process, the film-forming treatment solution is dried, for example, by increasing the rotation speed of the wafer W during a prescribed period of time. In this way, for example, part or all of the organic solvent contained in the film-forming treatment solution is evaporated so that the solid component contained in the film-forming treatment solution is solidified or cured, thereby the treatment film is formed on the pattern-formed surface of the wafer W.

Meanwhile, though not shown by the drawing, the drying process of the step S103 may be, for example, the process wherein inside the chamber 20 is brought to the state of a reduced pressure by means of a vacuuming device, or the process wherein the humidity inside the chamber 20 is lowered by the downflow gas supplied from the FFU 21. With these processes too, the film-forming treatment solution may be solidified or cured.

Alternatively, in the substrate cleaning device 14, the wafer W may be allowed to stand in the substrate cleaning device 14 until the film-forming solution is solidified or cured naturally. Further alternatively, by stopping the rotation of the wafer W, or by rotating the wafer W with the rotation speed at which the surface of the wafer W is not exposed by spinning out the film-forming treatment solution, the film-forming treatment solution may be solidified or cured.

Subsequently, in the substrate cleaning device 14, a removing process is performed (step S105). In this removing process, the treatment film formed on the wafer W is removed. By so doing, the particles P on the wafer W is removed together with the treatment film. The specific content of the removing process will be discussed later.

Subsequently, in the substrate cleaning device 14, a drying process of the wafer W, which was subjected to the rinsing process in the step S105, is performed (step S106). In this drying process, the nozzle 41_3 of the solution supply unit 40_1 is placed above the center of the wafer W. Thereafter, by opening the valve 44e for a prescribed period of time, IPA, which is used as the drying solvent, is supplied onto the wafer W. In this way, DIW on the wafer W is replaced by IPA. Further in the drying process, by increasing the rotation speed of the wafer W during a prescribed period of time, the wafer W is dried by spinning out IPA which is remained on the surface of the wafer W. Thereafter, the rotation of the wafer W is stopped.

Subsequently, in the substrate cleaning device 14, a substrate carrying-out process is performed (step S107). In this substrate carrying-out process, by means of the substrate transfer device 131 (see FIG. 3), the wafer W is taken out from the chamber 20 of the substrate cleaning device 14. Thereafter, the wafer W is accommodated in the carrier C which is placed in the carrier placing section 11 via the delivery unit 122 as well as the substrate transfer device 121. When the substrate carrying-out process is over, the substrate cleaning process of one sheet of the wafer W is completed.

Next, the specific example of the removing process of the step S105 will be explained. Here, when any of the compositions of Examples 12 to 16 is used as the film-forming treatment solution, depending on the composition ratio in the polymer (M1 to M10), there may exist the one that is soluble or hardly soluble in an alkali. Therefore, in the following, the explanation will be made separately as to the removing process wherein the film-forming treatment solution that is soluble in an alkali is used and as to the removing process wherein the film-forming treatment solution that is hardly soluble in an alkali is used.

Figure 6:
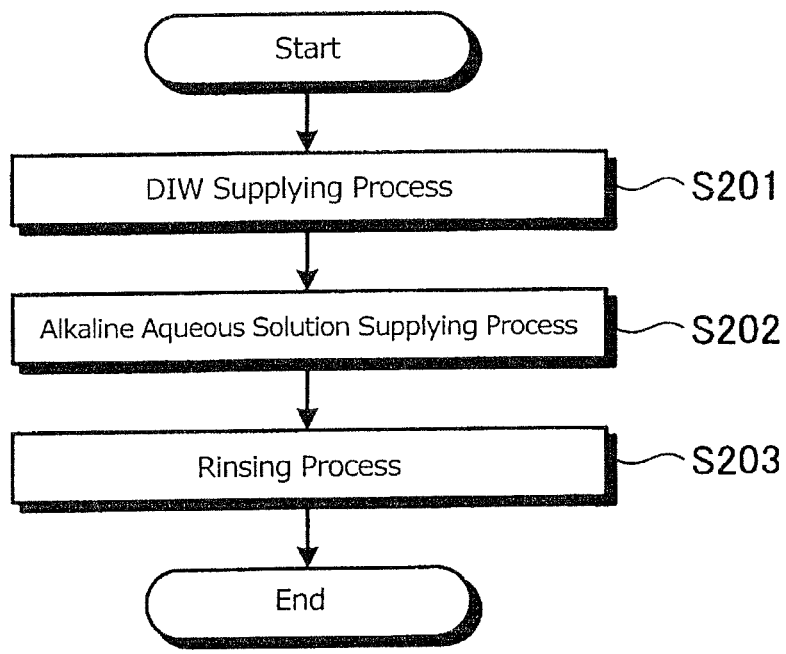
FIG. 6 is a flow chart showing a processing procedure of the removing process wherein a film-forming treatment solution that is soluble in an alkali is used.

Firstly, the example of the removing process wherein the film-forming treatment solution that is soluble in an alkali is used will be explained by referring to FIG. 6. FIG. 6 is a flow chart showing a processing procedure of the removing process wherein the film-forming treatment solution that is soluble in an alkali is used.

As shown in FIG. 6, in the substrate cleaning device 14, firstly a DIW supplying process is performed (step S201). In this DIW supplying process, the nozzle 41_1 of the solution supply unit 40_1 is placed above the center of the wafer W. Thereafter, by opening the valve 44a for a prescribed period of time, DIW, which is used as the stripping treatment solution, is supplied to the treatment film formed on the wafer W. DIW supplied to the treatment film is spread on the treatment film by a centrifugal force generated by rotation of the wafer W.

DIW is penetrated into the treatment film and reaches the interface between the treatment film and the wafer W, whereby stripping the treatment film from the wafer W. In this way, the particles P attached to the pattern-formed surface of the wafer W are stripped from the wafer W together with the treatment film.

Here, as mentioned above, the film-forming treatment solution contains the solvent and the polymer having the partial structure represented by the formula (1). By using the film-forming treatment solution like this, the removability of the treatment film from the wafer W is enhanced, so that the removing performance of the particles P on the wafer W can be enhanced.

Further, because the film-forming treatment solution has a high removability of the treatment film, it is conceived that this can be applied to substrates formed of various materials. Illustrative examples of the applicable substrate include metal or semi-metal substrates such as a silicon substrate, an aluminum substrate, a nickel substrate, a chromium substrate, a molybdenum substrate, a tungsten substrate, a copper substrate, a tantalum substrate, and a titanium substrate; and ceramic substrates such as a silicon nitride substrate, an alumina substrate, a silicon dioxide substrate, a tantalum nitride substrate, and a titanium nitride substrate. Among them, a silicon substrate, a silicon nitride substrate, and a titanium nitride substrate are preferable; however, a silicon nitride substrate is more preferable.

Subsequently, in the substrate cleaning device 14, an alkaline aqueous solution supplying process is performed (step S202). In this alkaline aqueous solution supplying process, by opening the valve 44*b* for a prescribed period of time, the alkaline aqueous solution, which is used as the dissolving treatment solution, is supplied to the treatment film stripped from the wafer W. In this way, the treatment film is dissolved.

When the alkaline aqueous solution is used as the dissolving treatment solution, the zeta potential having the same polarity in the wafer W and the particles P can be generated. With this, the wafer W and the particles P repel with each other, so that reattachment of the particles P to the wafer W can be avoided.

Subsequently, in the substrate cleaning device 14, a rinsing process is performed (step S203). In this rinsing process, the nozzle 41_2 of the solution supply unit 40_1 is placed above the center of the wafer W. Thereafter, by opening the valve 44*d* for a prescribed period of time, DIW is supplied as the rinsing solution to the rotating wafer W. In this way, the dissolved treatment film and the particles P floating in the alkaline aqueous solution are removed from the wafer W together with DIW. With this, the removing process is over, thereby moving to the drying process of the step S106.

In the way as mentioned above, when the film-forming treatment solution that is soluble in an alkali is used, by using the alkaline aqueous solution as the dissolving treatment solution, the treatment film can be dissolved.

Figure 7:
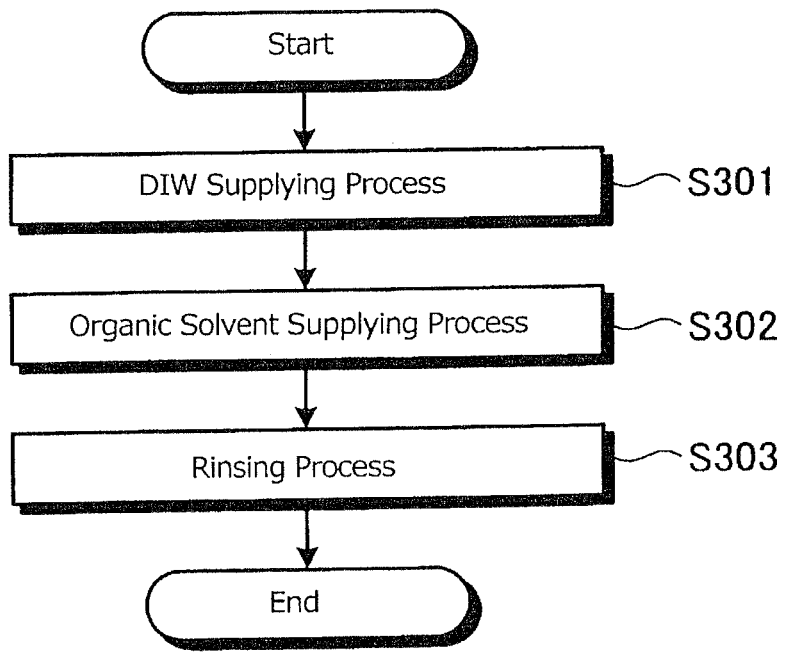
FIG. 7 is a flow chart showing a processing procedure of the removing process wherein a film-forming treatment solution that is hardly soluble in an alkali is used.

Next, the example of the removing process wherein the film-forming treatment solution that is hardly soluble in an alkali is used will be explained by referring to FIG. 7. FIG. 7 is a flow chart showing a processing procedure of the removing process wherein the film-forming treatment solution that is hardly soluble in an alkali is used.

As shown in FIG. 7, in the substrate cleaning device 14, firstly the same DIW supplying process as that of the step S201 mentioned above is performed (step S301).

Subsequently, in the substrate cleaning device 14, an organic solvent supplying process is performed (step S302). In this organic solvent supplying process, by opening the valve 44*c* for a prescribed period of time, an organic solvent, which is used as the dissolving treatment solution, is supplied to the treatment film stripped from the wafer W. In this way, the treatment film is dissolved.

Subsequently, in the substrate cleaning device 14, the same rinsing process as that of the step S203 is performed (step S303). In this way, the removing process is over, thereby moving to the drying process of the step S106.

When the film-forming treatment solution that is hardly soluble in an alkali is used as mentioned above, by using an organic solvent such as a thinner as the dissolving treatment solution, the treatment film can be dissolved. Further, because an alkaline aqueous solution is not used, the damages to the wafer W and the underlayer film can be suppressed furthermore.

Meanwhile, here, it is contemplated that after the organic solvent supplying process (step S302), the rinsing process (step S303) is performed; however, because the organic solvent evaporates on the wafer W, performance of the rinsing process (step S303) is not necessarily required.

Figure 8:
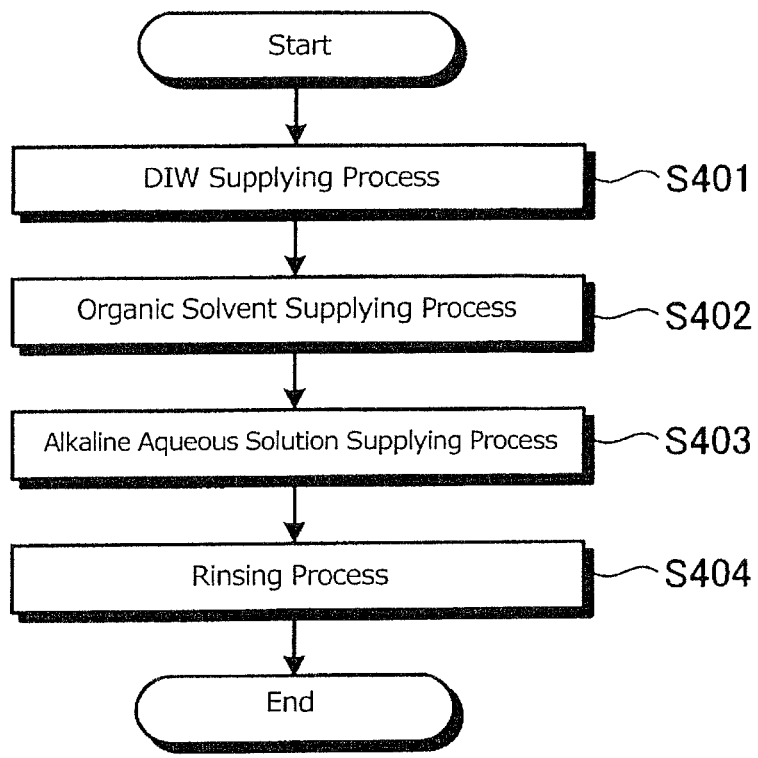
FIG. 8 is a flow chart showing a modified example (modified example 1) of the removing process wherein a film-forming treatment solution that is hardly soluble in an alkali is used.

Next, a modified example of the removing process wherein the film-forming treatment solution that is hardly soluble in an alkali is used will be explained by referring to FIG. 8. FIG. 8 is a flow chart showing the modified example (modified example 1) of the removing process wherein the film-forming treatment solution that is hardly soluble in an alkali is used.

As shown in FIG. 8, in the substrate cleaning device 14, firstly a DIW supplying process (step S401) is performed, followed by an organic solvent supplying process (step S402). These processes are the same as the processes of the step 301 and the step 302 as discussed above.

Subsequently, in the substrate cleaning device 14, an alkaline aqueous solution supplying process (step S403) is performed. In this alkaline aqueous solution supplying process, the nozzle 41_1 of the solution supply unit 40_1 is placed above the center of the wafer W. Then, by opening the valve 44*b* for a prescribed period of time, the alkaline aqueous solution is supplied onto the wafer W. Thereafter, in the substrate cleaning device 14, the same rinsing process (step S404) as that of the step S303 is performed; and with this, the removing process is completed.

In the way as mentioned above, the alkaline aqueous solution may be supplied to the wafer W after the organic solvent supplying process. By supplying the alkaline aqueous solution, the zeta potential having the same polarity in the wafer W and the particles P can be generated. With this, the wafer W and the particles P repel with each other, so that reattachment of the particles P to the wafer W can be avoided.

Figure 9:
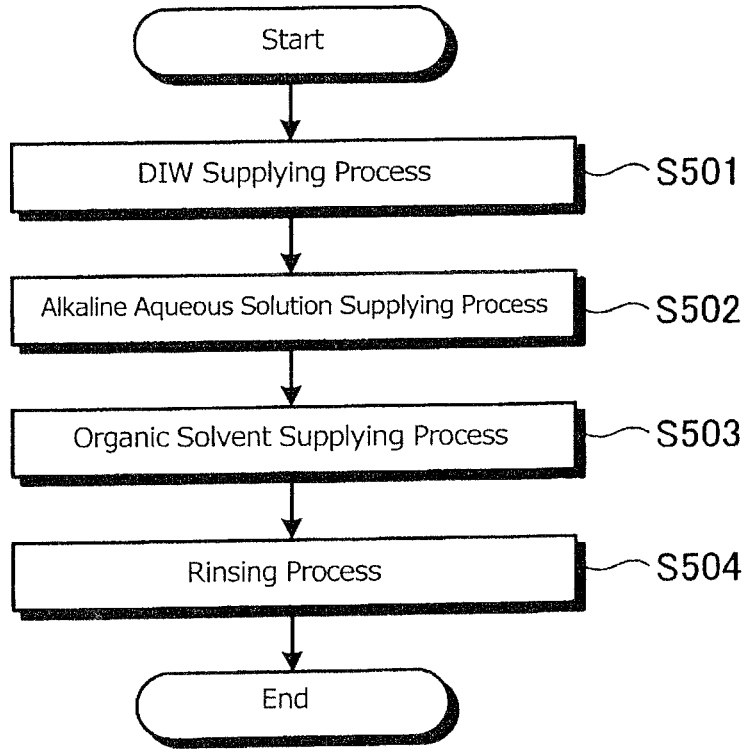
FIG. 9 is a flow chart showing a modified example (modified example 2) of the removing process wherein a film-forming treatment solution that is hardly soluble in an alkali is used.

Subsequently, another modified example of the removing process wherein the film-forming treatment solution that is hardly soluble in an alkali is used will be explained by referring to FIG. 9. FIG. 9 is a flow chart showing the modified example (modified example 2) of the removing process wherein the film-forming treatment solution that is hardly soluble in an alkali is used.

As shown in FIG. 9, in the substrate cleaning device 14, firstly the same DIW supplying process as that of the step S301 is performed (step S501).

Subsequently, in the substrate cleaning device 14, an alkaline aqueous solution supplying process is performed (step S502). In this alkaline aqueous solution supplying process, the nozzle 41_1 of the solution supply unit 40_1 is placed above the center of the wafer W. Thereafter, by opening the valve 44*b* for a prescribed period of time, the alkaline aqueous solution is supplied to the wafer W. Thereafter, in the substrate cleaning device 14, the same organic solvent supplying process (step S503) as that of the step S302, and the same rinsing process (step S504) as that of the step S303 are performed; and with this, the removing process is over. Meanwhile, the rinsing process of the step S504 may be omitted.

In the way as mentioned above, the alkaline aqueous solution may be supplied to the wafer W after the DIW supplying process. In the wafer W after the DIW supplying process, there is a possibility that part of certain components which are contained in the treatment film is remained. In these certain components, a component that is soluble in the alkaline aqueous solution is included. For this, as performed in this modified example, by supplying the alkaline aqueous solution to the wafer W after the DIW supplying process, among the components in the treatment film remained on the wafer W, the component that is soluble in the alkaline aqueous solution may be dissolved, so that it can be removed. Therefore, according to this modified example, the leftover film of the treatment film can be reduced.

Meanwhile, in the substrate cleaning device 14, after the organic solvent supplying process (step S503), the same alkaline aqueous solution supplying process as that of the step S403 may be performed.

In all the examples of the removing processes mentioned above, the treatment film is stripped from the wafer W by the DIW supplying process, which is then followed by performing the alkaline aqueous solution supplying process or the organic solvent supplying process to dissolve the treatment film. Alternatively, not limiting to these, the process to strip the treatment film from the wafer W and the process to dissolve the stripped treatment film may be performed in parallel in a single step. With regard to this point, the explanation will be made by referring to FIG. 10.

Figure 10:
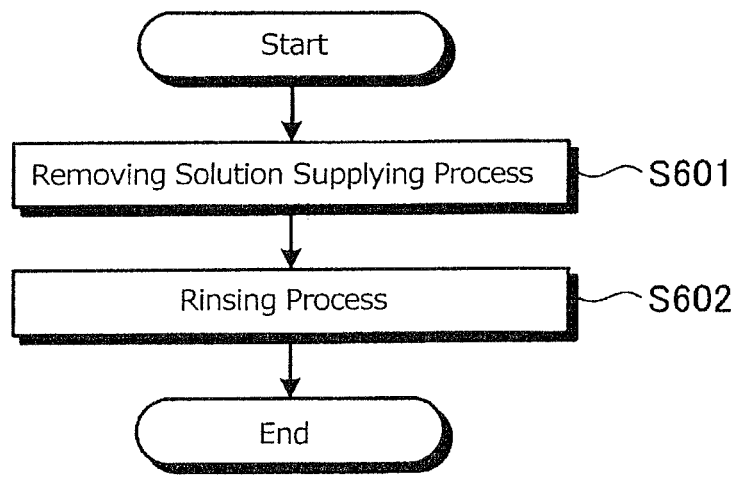
FIG. 10 is a flow chart showing a modified example of the removing process.

FIG. 10 is a flow chart showing the modified example of the removing process. Meanwhile, the processing procedure of the removing process shown in FIG. 10 can be applied to both the case that the film-forming treatment solution that is soluble in an alkali is used and the case that the film-forming treatment solution that is hardly soluble in an alkali is used.

As shown in FIG. 10, in the substrate cleaning device 14, a removing solution supplying process is performed (step S601). In this removing solution supplying process, the nozzle 41_1 of the solution supply unit 40_1 is placed above the center of the wafer W. Thereafter, by opening one of the valve 44b and the valve 44c as well as the valve 44a for a prescribed period of time, the diluted alkaline aqueous solution or the organic solvent is supplied to the wafer W.

The alkaline aqueous solution or the organic solvent as mentioned above is low in its concentration so that the treatment film can be stripped from the wafer W without substantially dissolving the treatment film. Therefore, similarly to the case when DIW is supplied, the particles P are stripped together with the treatment film from the wafer W. Thereafter, the treatment film stripped from the wafer W is dissolved by the alkaline aqueous solution or the organic solvent, the concentrations thereof being low. Thereafter, the same rinsing process (step S602) as that of the step S303 is performed thereby completing the removing process. Meanwhile, in the case when the diluted organic solvent is used as the removing solution, performance of the rinsing process of the step S602 is not necessarily required.

By using, as the removing solution, the alkaline aqueous solution or the organic solvent, both being diluted with DIW in the way as mentioned above, the process to strip the treatment film from the wafer W and the process to dissolve the stripped treatment film can be performed in parallel in a single step. In this way, the time necessary for the substrate cleaning process can be shortened.

Meanwhile, in the substrate cleaning device 14, by controlling any of the flow rate controllers 46a to 46c, concentration of the alkaline aqueous solution or the organic solvent may be gradually increased. For example, the substrate cleaning device 14 may supply, after it supplies the alkaline aqueous solution or the organic solvent having a first concentration, the alkaline aqueous solution or the organic solvent having a second concentration (this is higher concentration than the first concentration).

As discussed above, the substrate processing system of the exemplary embodiment of the present disclosure (corresponding to the substrate cleaning system 1) is provided with the holding unit (corresponding to the substrate holding mechanism 30) and the removing solution supply unit. The holding unit holds the substrate that has the treatment film formed thereon, wherein the treatment film contains the organic solvent and the fluorine-containing polymer (more preferably the polymer having the partial structure represented by the formula (1)) that is soluble in the organic solvent. The removing solution supply unit supplies the removing solution capable of removing the treatment film to the treatment film on the substrate.

Therefore, according to the substrate processing system of the exemplary embodiment of the present disclosure, a high removing performance of the particles can be obtained.

Other Exemplary Embodiments

In the exemplary embodiments discussed above, the examples wherein the "film-forming treatment solution supply unit" and the "removing solution supply unit" are arranged in a single chamber 20 have been explained; alternatively, each of the "film-forming treatment solution supply unit" and the "removing solution supply unit" may be arranged in different chambers. For example, the substrate cleaning system 1 may be provided with a chamber (first chamber) wherein the solution supply unit 40_2 is removed from the substrate cleaning device 14 shown in FIG. 4 and with a chamber (second chamber) wherein the solution supply unit 40_1 is removed from the substrate cleaning device 14 shown in FIG. 4.

Furthermore, the substrate cleaning system 1 does not necessarily require the "film-forming treatment solution supply unit". That is, the substrate cleaning system 1 may be the one which performs, to the wafer W processed till the step S104 shown in FIG. 5, the processes of the steps S105 to S107 shown in FIG. 5.

In the exemplary embodiments discussed above, the examples wherein DIW in the liquid state is used as the stripping treatment solution have been explained; however, the stripping treatment solution may be DIW in the mist state as well.

Further, in the exemplary embodiments discussed above, the examples wherein DIW is supplied directly to the treatment film by using the nozzle have been explained; however, by raising the humidity in the chamber by using, for example, a humidifier, DIW may be supplied indirectly to the treatment film.

Further, in the exemplary embodiments discussed above, the examples wherein DIW which is pure water with a normal temperature is used as the stripping treatment solution have been explained; however, for example, a heated pure water may be used as the stripping treatment solution as well. With this, the removing performance of the treatment film can be enhanced furthermore.

Further, in the exemplary embodiments discussed above, the examples wherein DIW is used as the stripping treatment solution have been explained. However, as far as the process wherein the treatment film formed on the wafer W is stripped without dissolving it (or before dissolving it) is feasible, any stripping treatment solution may be used. For example, the stripping treatment solution containing at least one of a CO2 water (DIW mixed with a CO2 gas), an acidic or alkaline aqueous solution, an aqueous solution to which a surfactant is added, a fluorine-based solvent such as HFE (hydrofluoroether), and diluted IPA (IPA (isopropyl alcohol) diluted with pure water) may be used.

For example, the film-forming treatment solution which has low adhesion with the wafer W and thus can form the readily strippable treatment film is formulated as a composition. In this case, the formed treatment film becomes readily strippable; on the other hand, however, because the water repellency thereof increases, there is a possibility that the penetration thereof becomes difficult if only DIW is used. Therefore, in such a case, an organic solvent diluted with pure water (hereinafter, also referred to as a "diluted organic solvent"), such as diluted IPA, may be used preferably.

Figure 11:
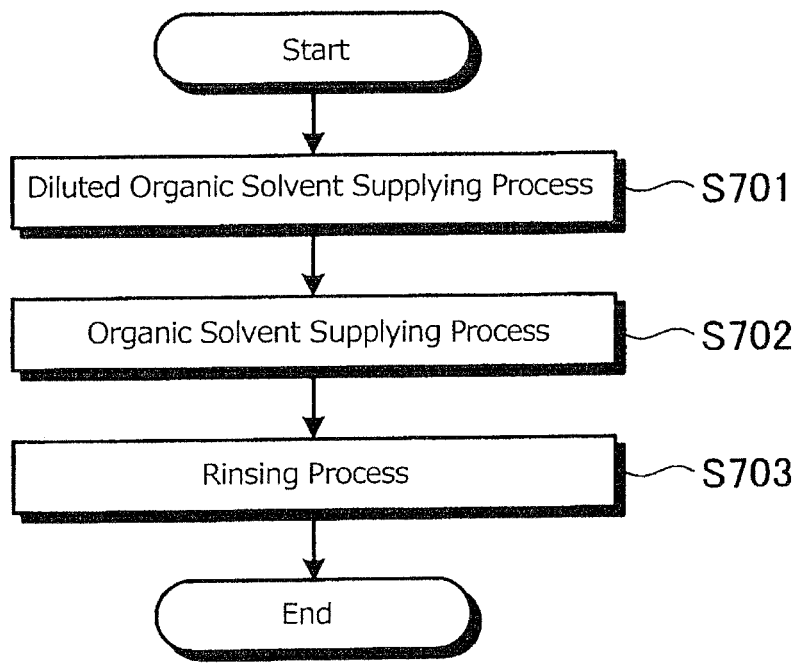
FIG. 11 is a flow chart showing a modified example of the removing process wherein a diluted organic solvent is used as the stripping treatment solution.

The case that the diluted organic solvent is used as the stripping treatment solution will be explained by using FIG. 11 to FIG. 12C. FIG. 11 is a flow chart showing a modified example of the removing process wherein the diluted organic solvent is used as the stripping treatment solution. FIG. 12A to 12C are explanatory drawings (example 1 to example 3) of the diluted organic solvent supplying process. Meanwhile, FIG. 11 corresponds to FIG. 7 which has already been shown. In FIG. 12A to FIG. 12C, drawings of the valves are omitted.

When the diluted organic solvent is used as the stripping treatment solution as shown in FIG. 11, in the substrate cleaning device 14, firstly, in place of the DIW supplying process of the step S301 in FIG. 7, the diluted organic solvent supplying process is performed (step S701).

In this diluted organic solvent supplying process, the diluted organic solvent with the concentration thereof being adjusted to the extent that the solvent can penetrate into the treatment film formed on the wafer W without dissolving this treatment film, for example, if the solvent is a diluted IPA, with the concentration thereof being 10% or less, is supplied to the wafer W.

In this way, the stripping treatment solution can penetrate even to the treatment film reaching a deep part of the pattern formed on the wafer W; and thus, a high removing performance of the particles can be obtained even in the wafer W formed with the pattern.

Subsequently, in the substrate cleaning device 14, the same organic solvent supplying process as that of the step S302 is performed (step S702).

Then, in the substrate cleaning device 14, the same rinsing process as that of the step S303 is performed (step S703). With this, the removing process is over, thereby moving to the drying process of the step S106.

Figure 12A:
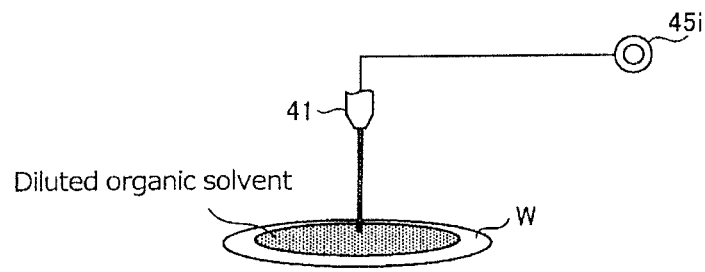
FIG. 12A is an explanatory drawing (example 1) of the diluted organic solvent supplying process.

Meanwhile, with regard to the specific supplying method of the diluted organic solvent, for example, as shown in FIG. 12A, firstly the diluted organic solvent source 45*i* is installed, and then, the diluted organic solvent can be supplied directly to the wafer W from the diluted organic solvent source 45*i* through the nozzle 41.

Figure 12B:
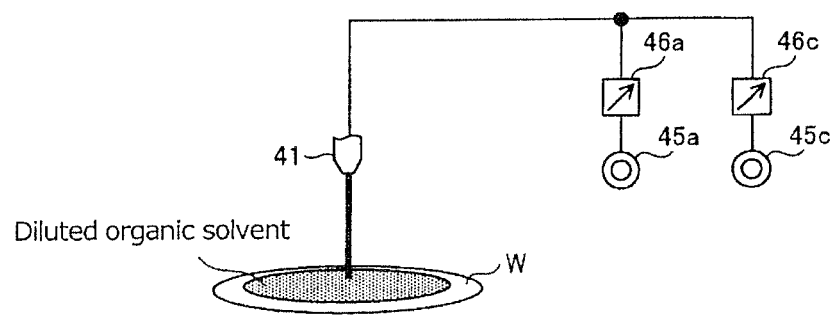
FIG. 12B is an explanatory drawing (example 2) of the diluted organic solvent supplying process.

Alternatively, for example, as shown in FIG. 12B, from the DIW source 45*a* via the flow rate controller 46*a* as well as from the organic solvent source 45*c* via the flow rate controller 46*c*, the internally mixed diluted organic solvent may be supplied to the wafer W through the nozzle 41.

Figure 12C:
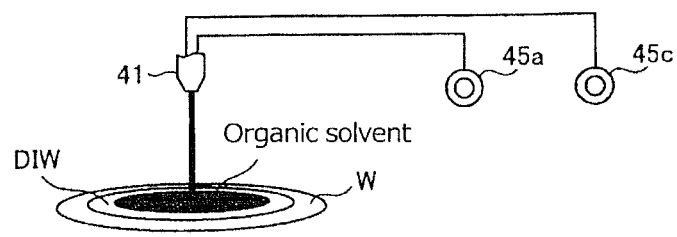
FIG. 12C is an explanatory drawing (example 3) of the diluted organic solvent supplying process.

Further alternatively, for example, as shown in FIG. 12C, after DIW is supplied to the wafer W from the DIW source 45*a*, an organic solvent is supplied to the wafer W from the organic solvent source 45*c* to mix them on the wafer W thereby forming the diluted organic solvent. In this case, DIW and the organic solvent may be supplied simultaneously to the wafer W as well.

As discussed above, in the case when the film-forming treatment solution having a low permeability is used, by using the diluted organic solvent as the stripping treatment solution, the stripping treatment solution can be made to penetrate into the treatment film more effectively. In addition, owing to this, a high removing performance of the particles can be obtained even in the wafer W formed with the pattern. Meanwhile, in the case that the diluted organic solvent is used as the stripping treatment solution explained here, specifically, it is preferable that this method be applied, for example, when the film-forming treatment solution contains as a base resin, the resin (P-3) or the resin (P-5) in the later shown Table 1.

In the exemplary embodiment discussed above, the case that the removing process is performed after performing the processes from the film-forming treatment solution supplying process to the drying process has been explained (see the step S103 to the step S105 in FIG. 5); however, alternatively before performing the removing process, the "film-formation facilitating process" to facilitate solidification or curing of the film-forming treatment solution may be performed.

Figure 13:
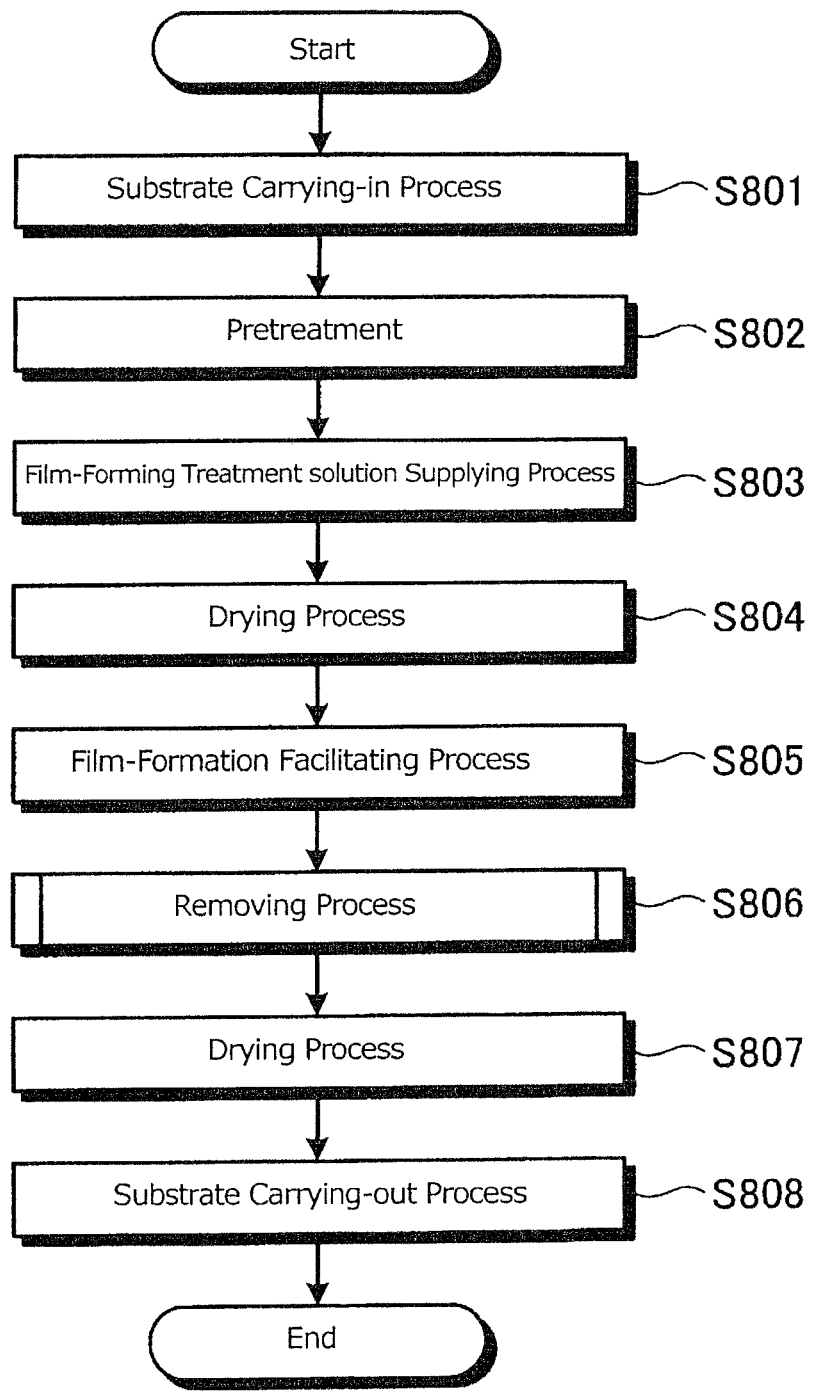
FIG. 13 is a flow chart showing a processing procedure of the substrate cleaning process performed by the substrate cleaning system according to another exemplary embodiment.

The other exemplary embodiments as mentioned above will be explained by using FIG. 13 to FIG. 16B. Firstly, FIG. 13 is a flow chart showing a processing procedure of the substrate cleaning process performed by the substrate cleaning system 1' according to the other exemplary embodiment. Meanwhile, FIG. 13 corresponds to FIG. 5 which has already been shown.

As shown in FIG. 13, in the substrate cleaning device 14 of the substrate cleaning system 1', firstly, the same substrate carrying-in process, pretreatment, film-forming treatment solution supplying process, and drying process as those of the step S101 to step S104 in FIG. 5 as mentioned before are performed (step S801 to step S804).

Subsequently, in the substrate cleaning device 14, the film-formation facilitating process is performed (step S805). In this film-formation facilitating process, the process to facilitate solidification or curing of the film-forming treatment solution supplied to the surface of the wafer W, for example, such a process as heating of the wafer W, is performed. Specific embodiments of this process will be explained later by using FIG. 14A and the drawings following thereafter.

By following the film-formation facilitating process mentioned above, for example, the film-forming treatment solution which has reached a deep part of the pattern formed on the wafer W can be surely solidified or cured so that the adhesion of the treatment film with the particles can be enhanced. That is, even in the wafer W formed with the pattern, the particles present even in the deep part of the pattern can be surely attached to the treatment film, so that a high removing performance of the particles can be obtained.

Then, in the substrate cleaning device 14, the same removing process, drying process, and the substrate carrying-out process as those of the step S105 to step S107 are performed (step S806 to step S808); and with this, the substrate cleaning process of the wafer W (the substrate cleaning process of one wafer) is completed.

Figure 14A:
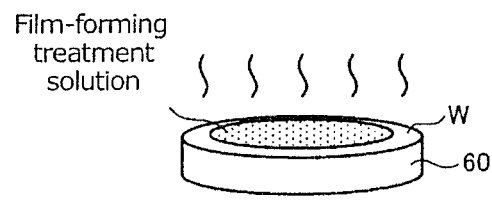
FIG. 14A is an explanatory drawing of the first film-formation facilitating process.
Figure 14B:
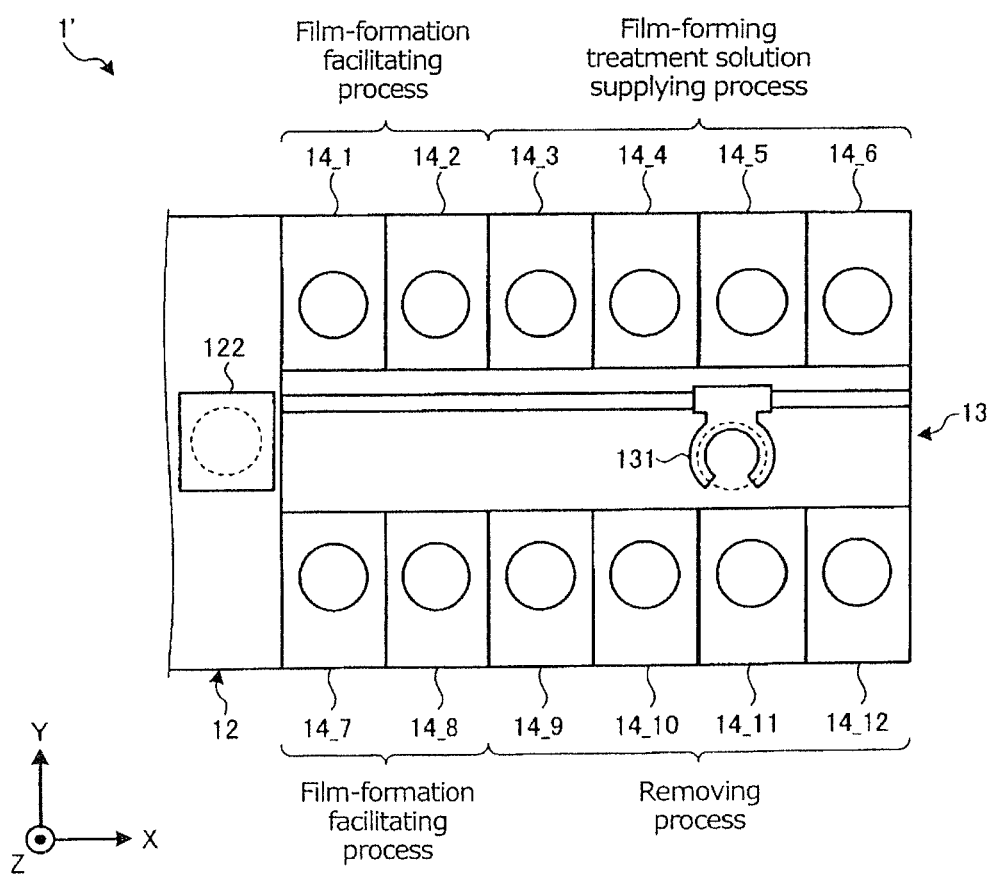
FIG. 14B is a schematic diagram illustrating a structure of the substrate cleaning system when the first film-formation facilitating process is performed.

Next, specific embodiments of the film-formation facilitating process will be explained. Firstly, the film-formation facilitating process as a first embodiment will be explained. FIG. 14A is an explanatory drawing of the first film-formation facilitating process. FIG. 14B is a schematic diagram illustrating a structure of the substrate cleaning system 1' when the first film-formation facilitating process is performed. Meanwhile, hereunder there are cases when the substrate cleaning device 14 is tagged with "_number" so as to distinguish each of a plurality of the substrate cleaning devices 14.

As shown in FIG. 14A, in the first film-formation facilitating process, for example, a baking device 60 is installed; and by so doing, the wafer W is baked by the baking device 60 so that the film-forming treatment solution supplied to the wafer W is heated up, thereby facilitating the solidification or curing of the film-forming treatment solution. Meanwhile, the first film-formation facilitating process may be performed before the drying process of the step S804 mentioned before. The conditions to bake the wafer W are preferably the temperature in the range of 70 to 120° C. and the time of about 60 seconds or less.

In the case when the first film-formation facilitating process is performed as the first embodiment, the "film-formation facilitating unit" including the baking device 60 is arranged at least in a chamber 20 which is different from the chamber 20 where the film-forming treatment solution supplying process is performed. In this way, the baking process can be performed with a high performance; and in addition, the baking process and the film-forming treatment solution supplying process can be performed in parallel in the different chambers.

Specifically, as shown in FIG. 14B, for example, if the arrangement is made such that the film-forming treatment solution supplying process is performed in the substrate cleaning devices 14_3 to 14_6 and the removing process is performed in the substrate cleaning devices 14_9 to 14_12, by accommodating the baking device 60 in the substrate cleaning devices 14_1, 14_2, 14_7, and 14_8 having the chambers 20 which are different from them, the first film-formation facilitating process may be performed in the substrate cleaning devices 14_1, 14_2, 14_7, and 14_8 thus arranged.

Figure 15A:
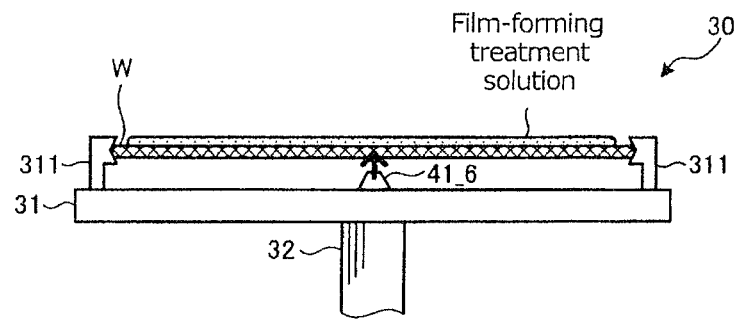
FIG. 15A is an explanatory drawing of the second film-formation facilitating process (example 1).
Figure 15B:
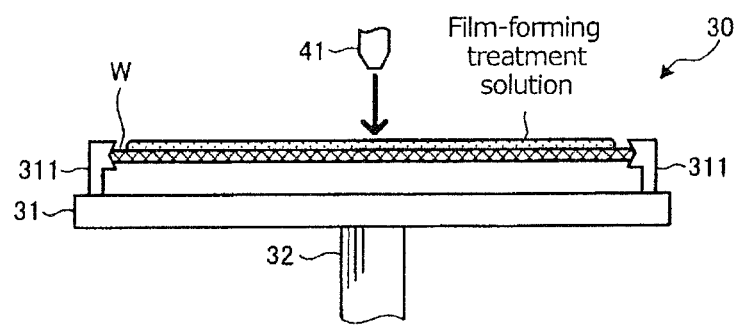
FIG. 15B is an explanatory drawing of the second film-formation facilitating process (example 2).
Figure 15C:
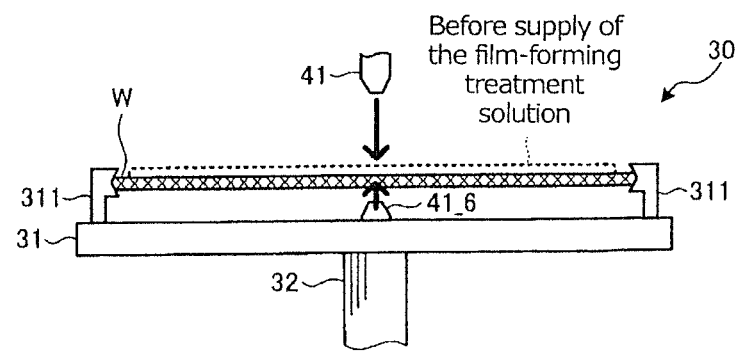
FIG. 15C is an explanatory drawing of the second film-formation facilitating process (example 3).
Figure 15D:
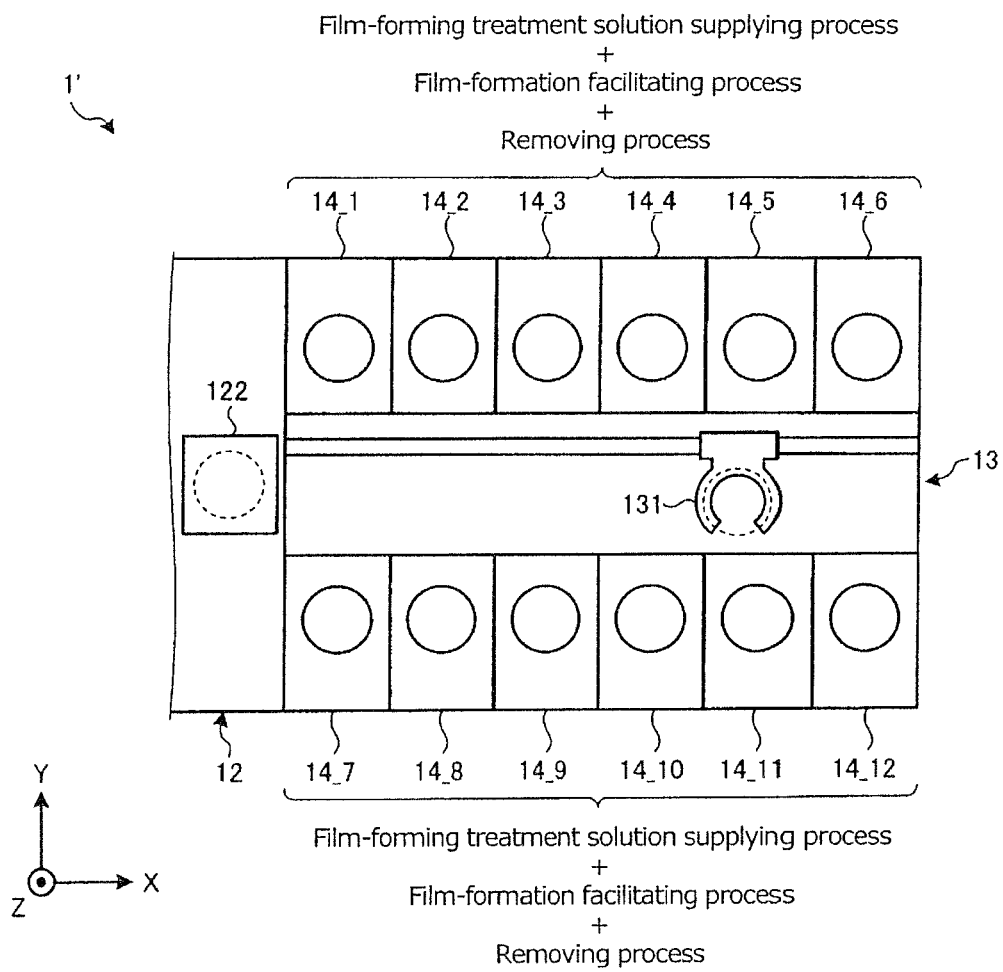
FIG. 15D is a schematic diagram illustrating a structure of the substrate cleaning system when the second film-formation facilitating process is performed (example 1).
Figure 15E:
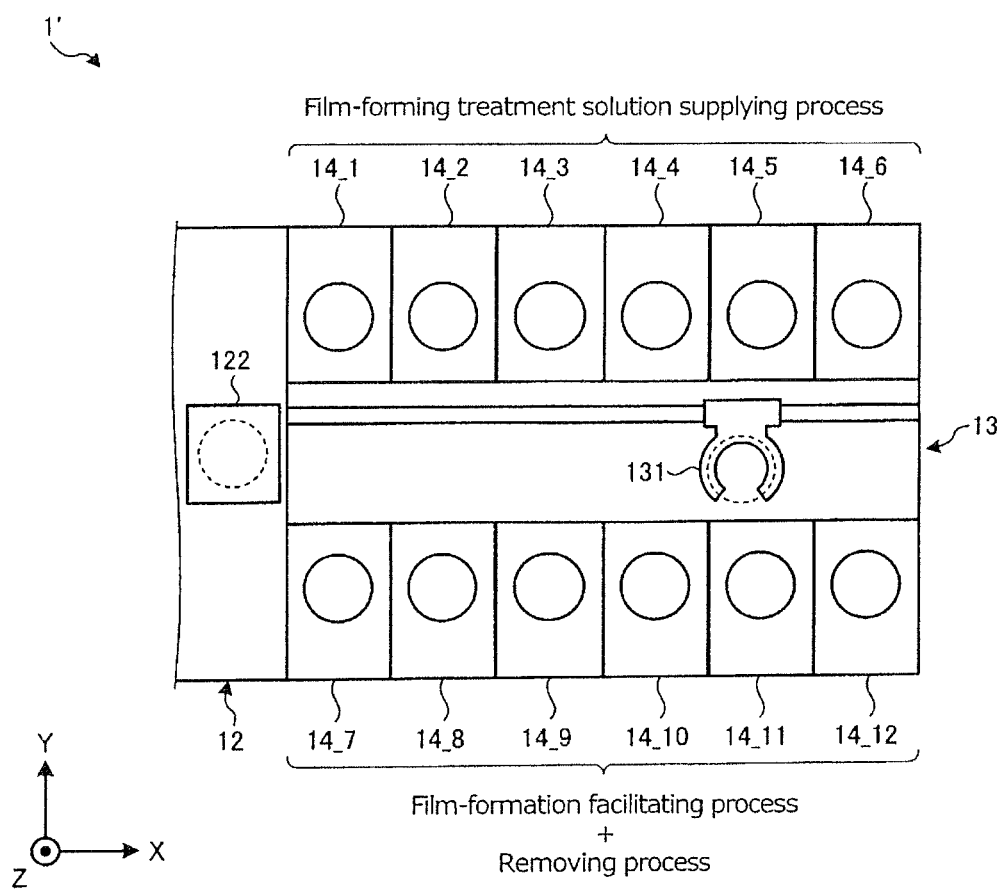
FIG. 15E is a schematic diagram illustrating a structure of the substrate cleaning system when the second film-formation facilitating process is performed (example 2).
Figure 15F:
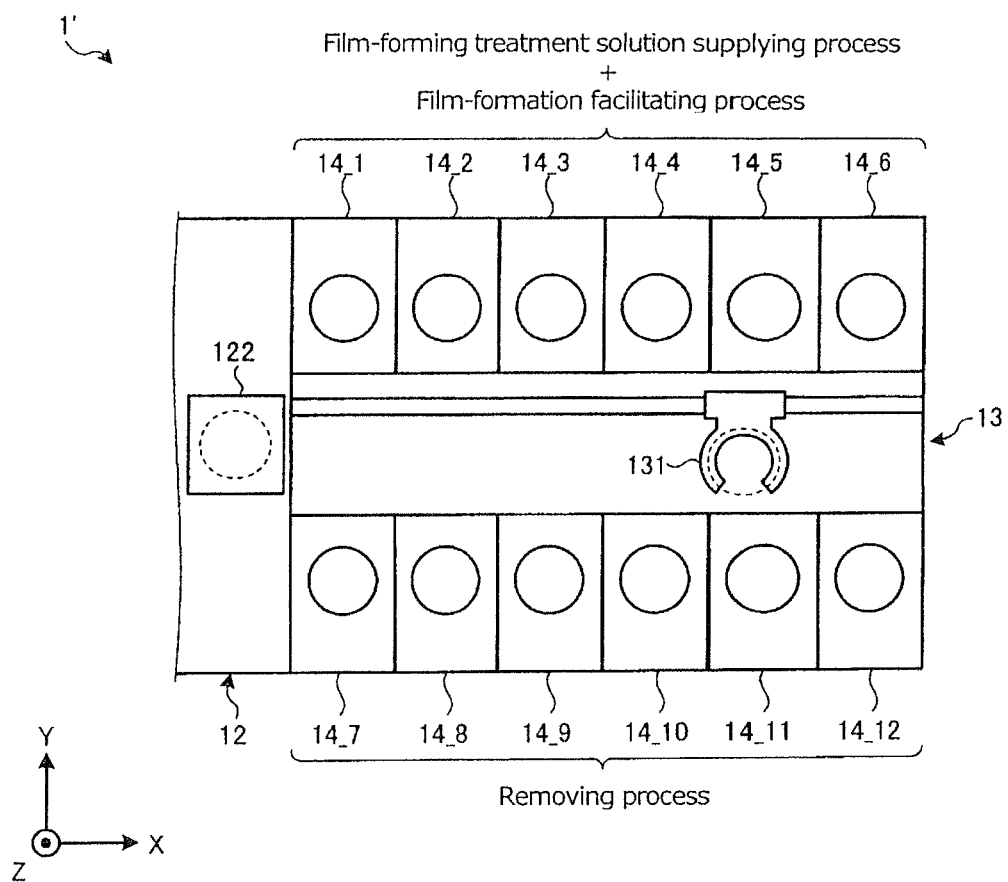
FIG. 15F is a schematic diagram illustrating a structure of the substrate cleaning system when the second film-formation facilitating process is performed (example 3).

Next, the film-formation facilitating process as a second embodiment will be explained. FIG. 15A to FIG. 15C are explanatory drawings of the second film-formation facilitating processes (example 1 to example 3). Further, FIG. 15D to FIG. 15F are schematic diagrams illustrating structures of the substrate cleaning system 1' when the second film-formation facilitating process is performed (example 1 to example 3).

As shown in FIG. 15A, in the second film-formation facilitating process, for example, in the substrate holding mechanism 30 a nozzle 41_6 is installed via the support unit 32; and by so doing, high-temperature DIA is supplied from the nozzle 41_6 to the backside of the wafer W which is held horizontally by the holding member 311 in the position above the rotation holding unit 31 with a small space from it thereby heating up the film-forming treatment solution on surface of the wafer W.

In this way, solidification or curing of the film-forming treatment solution on surface of the wafer W can be facilitated indirectly. Meanwhile, besides DIW, any fluid may be supplied from the nozzle 41_6 so far as it is a high-temperature fluid; and therefore, for example, a high-temperature nitrogen gas and a water vapor may be used as well.

In addition, not only from the back of the wafer W, but also from the surface of the wafer W, as shown in FIG. 15B, through the nozzle 41, the high-temperature fluid may be supplied to the film-forming treatment solution supplied to the surface of the wafer W so as to directly heat-up the film-forming treatment solution.

In addition, the second film-formation facilitating process shown in FIG. 15A and FIG. 15B may be performed during the film-forming treatment solution is supplied, that is, it may be performed in parallel with the film-forming treatment solution supplying process.

FIG. 15A and FIG. 15B show the examples wherein the second film-formation facilitating process is performed after or during the film forming treatment solution is supplied; however, as shown in FIG. 15C, before the film-forming treatment solution is supplied to the wafer W, the wafer W may be heated in advance by supplying the high-temperature fluid to the wafer W from the nozzle 41 or the nozzle 41_6 so as to indirectly heat-up the film-forming treatment solution.

In the case that the second film-formation facilitating process as mentioned above is performed, the "film-formation facilitating unit" including, for example, the nozzle 41_6 and the nozzle 41 may be arranged in the same chamber 20 as the chamber 20 in which the film-forming treatment solution supplying process and the removing process are performed.

Specifically, as shown in FIG. 15D, the arrangement may be made in such a way that, for example, all of the film-forming treatment solution supplying process, the second film-formation facilitating process, and the removing process may be performed in each of the substrate cleaning devices 14_1 to 14_12.

Further, as shown in FIG. 15E, for example, in the case that the arrangement is made such that the film-forming treatment solution supplying process is performed in the substrate cleaning devices 14_1 to 14_6, the arrangement may be made such that the second film-formation facilitating process and the removing process are performed in the substrate cleaning devices 14_7 to 14_12 having different chambers 20 from them.

Further, as shown in FIG. 15F, for example, the arrangement may be made such that both the film-forming treatment solution supplying process and the second film-formation facilitating process are performed in the substrate cleaning devices 14_1 to 14_6, and that the removing process is performed in the substrate cleaning devices 14_7 to 14_12. In this case, if the substrate holding mechanism 30 of the substrate cleaning devices 14_1 to 14_6 holds the wafer W, for example, by a vacuum chuck with a suction type, at least the second film-formation facilitating process from the surface of the wafer W shown in FIG. 15B and FIG. 15C can be performed in each of the substrate cleaning devices 14_1 to 14_6.

Figure 16A:
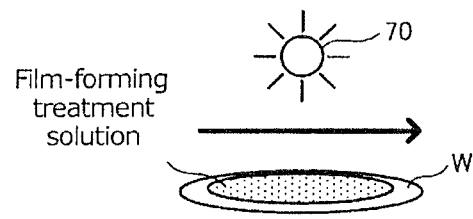
FIG. 16A is an explanatory drawing of the third film-formation facilitating process.

Next, the film-formation facilitating process as a third embodiment will be explained. FIG. 16A is an explanatory drawing of the third film-formation facilitating process. Further, FIG. 16B is a schematic diagram illustrating a structure of the substrate cleaning system 1' when the third film-formation facilitating process is performed.

As shown in FIG. 16A, in the third film-formation facilitating process, for example, a heat source 70 as the "film-formation facilitating unit" is arranged in somewhere in any of the transfer sections 12 and 13; and by so doing, during the wafer W supplied on its surface with the film-forming treatment solution is passing near the heat source 70, the film-forming treatment solution is heated-up by the heat of the heat source 70. In this way, solidification or curing of the film-forming treatment solution on surface of the wafer W can be facilitated. Meanwhile, the film-forming treatment solution may be heated from any of the surface and the back of the wafer W.

Figure 16B:
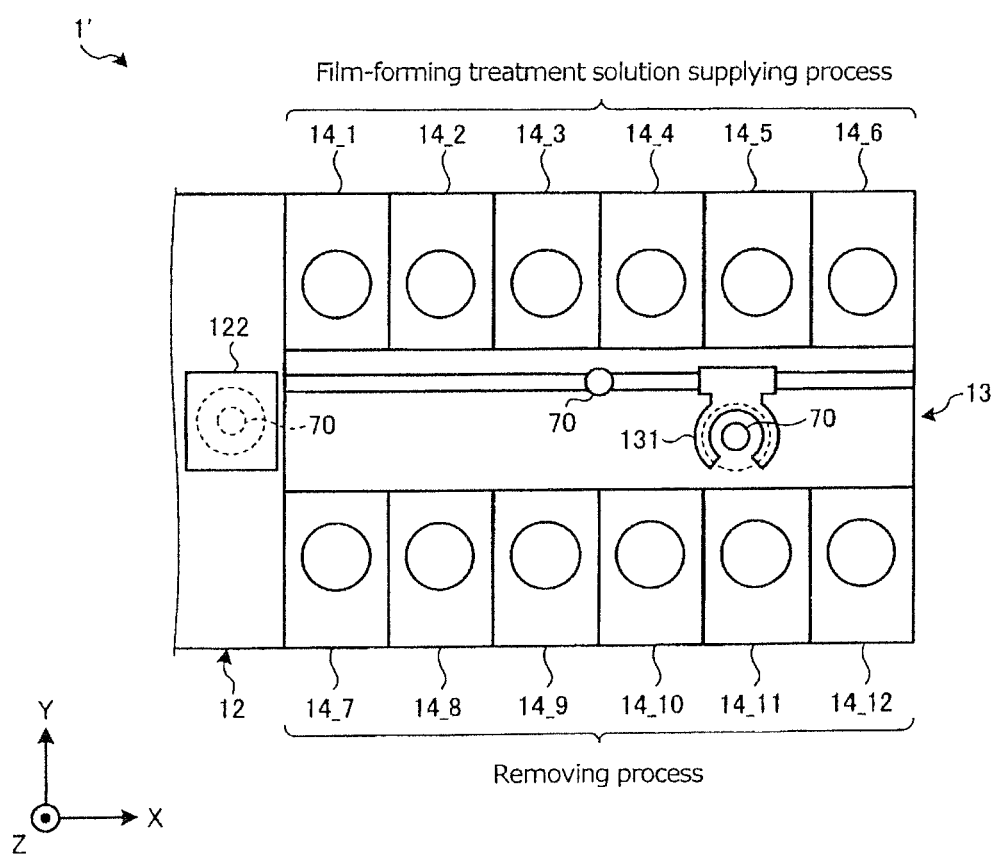
FIG. 16B is a schematic diagram illustrating a structure of the substrate cleaning system when the third film-formation facilitating process is performed.

The heat source 70 includes, for example, a halogen lamp; and in the case that the arrangement is made such that, as shown in FIG. 16B, the film-forming treatment solution supplying process is performed in the substrate cleaning devices 14_1 to 14_6 and that the removing process is performed in the substrate cleaning devices 14_7 to 14_12, it may be arranged in the transfer pathway in the transfer section 13, in the wafer holding mechanism of the substrate transfer device 131, in the delivery unit 122 in the transfer section 12, or the like. The heat source 70, if it is arranged in the wafer holding mechanism of the substrate transfer device 131, during the wafer W supplied with the film-forming treatment solution is being held with this wafer holding mechanism, heats up the film-forming treatment solution.

Meanwhile, in the third film-formation facilitating process, not only the heat source 70 but also a UV (ultraviolet) source may be installed in place of the heat source 70; and by so doing, solidification or curing of the film-forming treatment solution may be facilitated by irradiation of a UV light by means of this UV source.

In all the exemplary embodiments discussed above, the explanation was made with regard to the examples in which an alkaline developing solution is used as the dissolving treatment solution; however, the dissolving treatment solution may also be the alkaline developing solution to which a hydrogen peroxide aqueous solution is added. By adding the hydrogen peroxide aqueous solution to the alkaline developing solution as mentioned above, the surface-roughing of the surface of the wafer W due to the alkaline developing solution may be suppressed. Further, the dissolving treatment solution may be an acidic developing solution such as acetic acid, formic acid, and hydroxyacetic acid.

Furthermore, the dissolving treatment solution may contain a surfactant. Because the surfactant can weaken a surface tension force, reattachment of the particles P to the wafer W etc. can be suppressed. Unwanted substances to be removed may include not only the particles P but also, for example, a substance such as a polymer which is left on the substrate after dry etching or after ashing.

EXAMPLES

Next, Examples of the composition for substrate cleaning will be explained.

The weight-average molecular weight (Mw) and the number-average molecular weight (Mn) of the obtained polymer were measured by using the GPC column (manufactured by Tosoh Corp.; two columns of G2000 HXL, one column of G3000 HXL, and one column of G4000 HXL), with the flow rate of 1.0 mL/minute, the eluting solvent of tetrahydrofuran, the sample concentration of 1.0% by mass, the sample injection amount of 100 μL, the column temperature of 40° C., and the detector of a differential refractometer, based on the gel permeation chromatography (GPC) by using the monodisperse polystyrene as the standard. The dispersity (Mw/Mn) was calculated from the measurement results of Mw and Mn.

Synthesis of Polymers

Compounds used as the raw materials of the polymers are shown below.

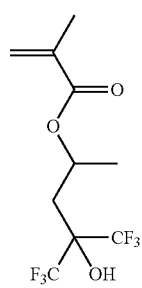
(M-1)

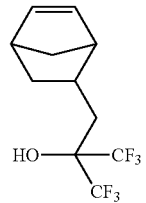
(M-2)

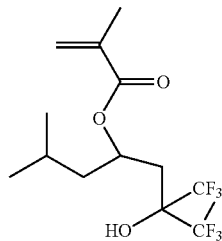
(M-3)

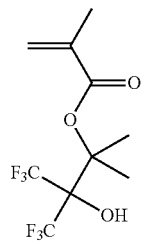
(M-4)

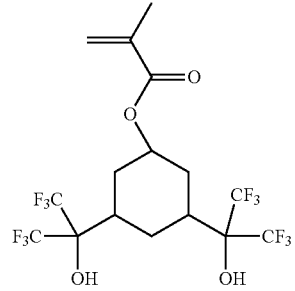
(M-5)

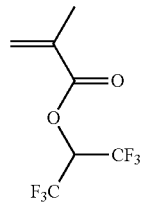
(M-6)

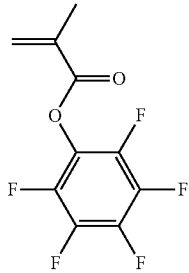
(M-7)

(M-8)

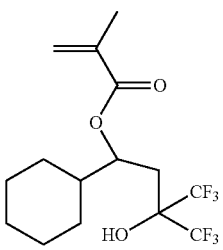

(M-9)

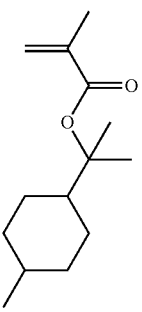

(M-10)

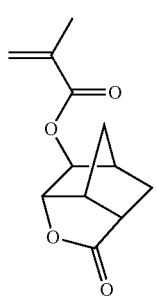

(M-11)

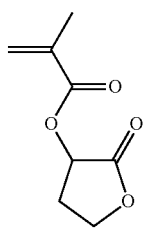

(M-12)

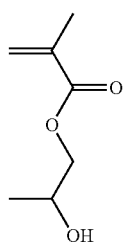

(M-13)

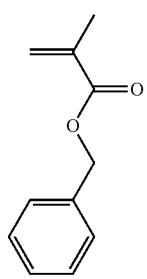

Production Example 1

A monomer solution was prepared by dissolving 100 g (100% by mole) of the compound (M-1) and 7.29 g (7% by mole) of azobis-iso-butyronitrile (AIBN) into 100 g of 2-butanone. A 1000-mL three-necked flask charged with 100 g of 2-butanone was purged with a nitrogen gas for 30 minutes. After the nitrogen purge, the flask was heated to 80° C.; and then, the monomer solution was gradually dropped by using a dropping funnel with stirring for the period of 3 hours. By taking the start of the dropping as the starting time of the polymerization, the polymerization was carried out for 6 hours. After the polymerization, the reaction solution was cooled to 30° C. or lower. The reaction solution was concentrated under reduced pressure until the mass thereof reached 150 g. Then, 150 g of methanol and 750 g of n-hexane were added for the phase separation. After the separation, the lower phase was recovered. To the recovered lower phase, 750 g of n-hexane was added; and again the phase separation was carried out for purification. After the separation, the lower phase was recovered. From the recovered lower phase, the solvent was removed, and then 4-methyl-2-pentanol was added to obtain a solution containing the resin (P-1). The results thereof are shown in Table 1.

Production Examples 2 to 10

Production Example 1 was repeated, except that the compounds to be used and the combination thereof were changed in accordance with those shown in Table 1, to obtain the resins (P-2) to (P-10).

TABLE 1

| Production Example | Resin | Composition ratio (mol %) | Yield (%) | Weight-average molecular weight (Mw) | Dispersity |
|---|---|---|---|---|---|
| 1 | P-1 | M-1(100) | 80 | 10,500 | 1.52 |
| 2 | P-2 | M-2(100) | 79 | 10,400 | 1.51 |
| 3 | P-3 | M-3(100) | 80 | 10,000 | 1.55 |
| 4 | P-4 | M-4/M-5(70/30) | 80 | 10,520 | 1.53 |
| 5 | P-5 | M-1/M-6(90/10) | 81 | 9,900 | 1.5 |
| 6 | P-6 | M-4/M-6(80/20) | 78 | 10,200 | 1.51 |
| 7 | P-7 | M-6/M-8(50/50) | 79 | 10,450 | 1.52 |
| 8 | P-8 | M-3/M-6(70/30) | 82 | 10,000 | 1.52 |
| 9 | P-9 | M-9/M-10(50/50) | 84 | 7,400 | .35 |
| 10 | P-10 | M-11/M-12/M-13 (30/40/30) | 90 | 80,000 | 1.85 |

Example 1

A homogeneous solution was prepared by mixing 100 parts by mass of the polymer (P-1) and 7,400 parts by mass of 4-methyl-2-pentanol. This solution was filtrated by using a filter made of HDPE (PhotoKleen EZD, manufactured by Nippon Pall Corp.; pore diameter of 5 nm). It was confirmed that the number of the particles with the size of 150 μm or less in the solution was decreased to 10 particles/mL by the solution particle counter (KS-41B, manufactured by RION Co., Ltd.) to obtain the composition for substrate cleaning (D-1). The solid content concentration thereof was about 1.5%.

Examples 2 to 8 and Comparative Examples 1 and 2

Example 1 was repeated except that the resin was changed to those shown in Table 2 to obtain the compositions for substrate cleaning (D-2) to (D-8) and the comparative compositions (c-1) and (c-2).

Example 9

A homogeneous solution was prepared by mixing 100 parts by mass of the polymer (P-1), 5.0 parts by mass of tartaric acid (Ac-1) as an organic acid, and 7,400 parts by mass of 4-methyl-2-pentanol. This solution was filtrated by using a filter made of HDPE (PhotoKleen EZD, manufactured by Nippon Pall Corp.; pore diameter of 5 nm). It was confirmed that the number of the particles with the size of 150 μm or less in the solution was decreased to 10 particles/mL by the solution particle counter (KS-41B, manufactured by RION Co., Ltd.) to obtain the composition for substrate cleaning (D-1). The solid content concentration thereof was about 1.5%.

Examples 10 to 16 and Comparative Examples 3 to 5

Example 9 was repeated except that the resin and the organic acid were changed to those shown in Table 2 to obtain the compositions for substrate cleaning (D-10) to (D-16) and the comparative compositions (c-3) to (c-5).

TABLE 2

| | | Resin | | Organic acid | |
|---|---|---|---|---|---|
| Run | Composition | Kind | Parts by mass | Kind | Parts by mass |
| Example 1 | D-1 | P-1 | 100 | — | — |
| Example 2 | D-2 | P-2 | 100 | — | — |
| Example 3 | D-3 | P-3 | 100 | — | — |
| Example 4 | D-4 | P-4 | 100 | — | — |
| Example 5 | D-5 | P-5 | 100 | — | — |
| Example 6 | D-6 | P-6 | 100 | — | — |
| Example 7 | D-7 | P-7 | 100 | — | — |
| Example 8 | D-8 | P-8 | 100 | — | — |
| Example 9 | D-9 | P-1 | 100 | Ac-1 | 5 |
| Example 10 | D-10 | P-2 | 100 | Ac-2 | 5 |
| Example 11 | D-11 | P-3 | 100 | Ac-3 | 5 |
| Example 12 | D-12 | P-4 | 100 | Ac-4 | 5 |
| Example 13 | D-13 | P-5 | 100 | Ac-5 | 5 |
| Example 14 | D-14 | P-6 | 100 | Ac-6 | 5 |
| Example 15 | D-15 | P-7 | 100 | Ac-7 | 5 |
| Example 16 | D-16 | P-8 | 100 | Ac-8 | 5 |
| Comparative Example 1 | c-1 | P-9 | 100 | — | — |
| Comparative Example 2 | c-2 | P-10 | 100 | — | — |
| Comparative Example 3 | c-3 | P-9 | 100 | Ac-1 | 5 |
| Comparative Example 4 | c-4 | P-9 | 100 | Ac-9 | 5 |
| Comparative Example 5 | c-5 | P-10 | 100 | Ac-2 | 5 |

The organic acids used in each of Examples and Comparative Examples are shown below. In these Examples, all the organic acids are the reagents manufactured by Wako Pure Chemical Industries, Ltd.
Ac-1: tartaric acid
Ac-2: oxalic acid
Ac-3: citric acid
Ac-4: maleic acid
Ac-5: malic acid
Ac-6: fumaric acid
Ac-7: isophthalic acid
Ac-8: terephthalic acid
Ac-9: polyacrylic acid (Polyacrylic acid 5000, manufactured by Wako Pure Chemical Industries, Ltd.)

Evaluation of the Particle Removability and the Film Removability

On the 12-inch wafer previously attached with silica particles having the particle diameter of 200 nm was formed the treatment film of each composition by a spin coating method by using the substrate cleaning device 14. To the wafer formed with the treatment film, a tetramethyl ammonium hydroxide aqueous solution (TMAH solution) with the concentration of 2.38% by mass was supplied as a dissolving treatment solution to remove the treatment film. The removability thereof was judged as "A" if removal of all the treatment film was completed within 20 seconds from the start of the supply of the TMHA solution, as "B" if the removal was completed over 20 seconds and within 1 minute, and as "C" if the removal was not completed within 1 minute. Further, the number of the silica particles remained on the wafer after removal of the treatment film was analyzed by using a dark field defect inspection device (SP2, manufactured by KLA-Tencor Corp.). It was judged as "A" if the removing rate of the silica particles was 70% or more, as "B" if the removing rate was 30% or more and less than 70%, and as "C" if the removing rate was less than 30%. Meanwhile, if the treatment film could not be formed, the description of "Inapplicable" was made in the particle removability column.

Evaluation Examples 1 to 16 and Comparative Evaluation Examples 1 to 5

By using the silicon wafer as the wafer and each of the compositions for substrate cleaning (D-1) to (D-16) as well as the comparative compositions (c-1) to (c-5), the particle removability and the film removability were evaluated in accordance with the evaluation method mentioned above. These results are shown in Table 3.

TABLE 3

| Run | Composition | Particle removability | Film removability |
|---|---|---|---|
| Evaluation Example 1 | D-1 | A | A |
| Evaluation Example 2 | D-2 | A | A |
| Evaluation Example 3 | D-3 | B | A |
| Evaluation Example 4 | D-4 | A | A |
| Evaluation Example 5 | D-5 | A | B |
| Evaluation Example 6 | D-6 | A | B |
| Evaluation Example 7 | D-7 | A | B |
| Evaluation Example 8 | D-8 | B | B |
| Evaluation Example 9 | D-9 | A | A |
| Evaluation Example 10 | D-10 | A | A |
| Evaluation Example 11 | D-11 | A | A |
| Evaluation Example 12 | D-12 | A | A |
| Evaluation Example 13 | D-13 | A | A |
| Evaluation Example 14 | D-14 | A | A |
| Evaluation Example 15 | D-15 | A | A |
| Evaluation Example 16 | D-16 | A | A |
| Comparative Evaluation Example 1 | c-1 | C | C |
| Comparative Evaluation Example 2 | c-2 | C | A |
| Comparative Evaluation Example 3 | c-3 | C | C |

TABLE 3-continued

| Run | Composition | Particle removability | Film removability |
|---|---|---|---|
| Comparative Evaluation Example 4 | c-4 | Inapplicable | Inapplicable |
| Comparative Evaluation Example 5 | c-5 | C | A |

Evaluation Examples 17 to 24 and Comparative Evaluation Examples 6 and 7

The particle removability and the film removability were evaluated in the same way as before except that the silicon wafer was changed to silicon nitride or to titanium nitride and that the combination thereof with the composition for substrate cleaning was changed to those shown in Table 4. These results are shown in Table 4.

TABLE 4

| | | Wafer material | | | |
|---|---|---|---|---|---|
| | | SiN | | TiN | |
| Run | Composition | Particle removability | Film removability | Particle removability | Film removability |
| Evaluation Example 17 | D-9 | A | A | A | A |
| Evaluation Example 18 | D-10 | A | A | A | A |
| Evaluation Example 19 | D-11 | A | A | A | A |
| Evaluation Example 20 | D-12 | A | A | A | A |
| Evaluation Example 21 | D-13 | A | B | A | B |
| Evaluation Example 22 | D-14 | A | B | A | B |
| Evaluation Example 23 | D-15 | A | B | A | B |
| Evaluation Example 24 | D-16 | A | B | A | B |
| Comparative Evaluation Example 6 | c-3 | C | C | C | C |
| Comparative Evaluation Example 7 | c-4 | Inapplicable | Inapplicable | Inapplicable | Inapplicable |

From the comparison between each of Evaluation Examples and Comparative Evaluation Examples, it can be seen that the composition for substrate cleaning according to the present invention is excellent in both the particle removability and the film removability in the substrate cleaning method wherein the film is formed on the substrate surface and then removed. Further, from the comparison between Evaluation Examples 5 to 8 and Comparative Evaluation Examples 13 to 16, it can be seen that the film removability can be enhanced furthermore by adding the organic acids.

Evaluation Examples 25 to 31 and Comparative Evaluation Example 8

The procedure of Evaluation Examples 4, 5, and 12 to 16, and Comparative Evaluation Example 3 was repeated except that pure water was used as a stripping treatment solution in place of the dissolving treatment solution to evaluate the particle removability and the film removability. These results are shown in Table 5.

TABLE 5

| Run | Composition | Particle removability | Film removability |
|---|---|---|---|
| Evaluation Example 25 | D-4 | A | A |
| Evaluation Example 26 | D-5 | A | B |
| Evaluation Example 27 | D-12 | A | A |
| Evaluation Example 28 | D-13 | A | A |
| Evaluation Example 29 | D-14 | A | A |
| Evaluation Example 30 | D-15 | A | A |
| Evaluation Example 31 | D-16 | A | A |

TABLE 5-continued

| Run | Composition | Particle removability | Film removability |
|---|---|---|---|
| Comparative Evaluation Example 8 | c-3 | C | C |

Evaluation Examples 32 to 36 and Comparative Evaluation Example 9

The procedure of Evaluation Examples 20 to 24, and Comparative Evaluation Example 6 was repeated except that pure water was used as a stripping treatment solution in place of the dissolving treatment solution to evaluate the particle removability and the film removability. These results are shown in Table 6.

TABLE 6

| | | Wafer material | | | |
| | | SiN | | TiN | |
| Run | Composition | Particle removability | Film removability | Particle removability | Film removability |
|---|---|---|---|---|---|
| Evaluation Example 32 | D-12 | A | A | A | A |
| Evaluation Example 33 | D-13 | B | B | A | A |
| Evaluation Example 34 | D-14 | B | B | A | A |
| Evaluation Example 35 | D-15 | B | B | A | A |
| Evaluation Example 36 | D-16 | B | B | A | A |
| Comparative Evaluation Example 9 | c-3 | C | C | C | C |

Further effects and modification examples may be readily thought out by those skilled in the art. Therefore, a wider embodiment of the present invention is not limited to certain detailed and representative exemplary embodiments as shown and described above. Consequently, various modifications may be possible without departing from the idea or scope of the overall concept of the invention that is defined by the attached claims and the equivalents thereof.

(1) A substrate processing system comprising:
a holding unit configured to hold a substrate that has a treatment film formed thereon, wherein the treatment film comprises an organic solvent and a fluorine-containing polymer that is soluble in the organic solvent; and
a removing solution supply unit configured to supply to the treatment film formed on the substrate, a removing solution capable of removing the treatment film.

(2) The substrate processing system according to (1), wherein the polymer has a partial structure represented by the following formula (1):

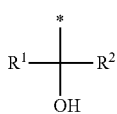
(1)

wherein
$R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1 to 8 carbon atoms; and
the symbol * shows a bonding site with another atom constituting the polymer.

(3) The substrate processing system according to (1) or (2), wherein the removing solution supply unit comprises:
a stripping treatment solution supply unit configured to supply to the treatment film, a stripping treatment solution capable of stripping the treatment film from the substrate; and
a dissolving treatment solution supply unit configured to supply to the treatment film, a dissolving treatment solution capable of dissolving the treatment film.

(4) The substrate processing system according to (3), comprising:
a rinsing solution supply unit configured to supply to the substrate a rinsing solution, and
a control unit configured to control a series of substrate processings, wherein
the dissolving treatment solution supply unit is an alkaline aqueous solution supply unit configured to supply an alkaline aqueous solution as the dissolving treatment solution, and
the control unit controls the stripping treatment solution supply unit, the alkaline aqueous solution supply unit, and the rinsing solution supply unit so that a process of supplying to the treatment film the stripping treatment solution is performed, and then a process of supplying to the substrate the alkaline aqueous solution is performed, and then a process of supplying to the substrate the rinsing solution is performed.

(5) The substrate processing system according to (3), comprising a control unit configured to control a series of substrate processings, wherein
the dissolving treatment solution supply unit is an organic solvent supply unit configured to supply an organic solvent as the dissolving treatment solution, and
the control unit controls the stripping treatment solution supply unit and the organic solvent supply unit so that a process of supplying to the treatment film the stripping treatment solution is performed, and then a process of supplying to the substrate the organic solvent.

(6) The substrate processing system according to (3), comprising:
an alkaline aqueous solution supply unit configured to supply to the substrate an alkaline aqueous solution,
a rinsing solution supply unit configured to supply to the substrate a rinsing solution, and
a control unit configured to control a series of substrate processings, wherein
the dissolving treatment solution supply unit is an organic solvent supply unit configured to supply an organic solvent as the dissolving treatment solution, and
the control unit controls the stripping treatment solution supply unit, the organic solvent supply unit, the alkaline aqueous solution supply unit, and the rinsing solution supply unit so that a process of supplying to the treatment film the stripping treatment solution is performed, and then a process of supplying to the substrate the organic solvent is performed, and then a process of supplying to the substrate the alkaline aqueous solution is performed, and then a process of supplying to the substrate the rinsing solution is performed.

(7) The substrate processing system according to (3), comprising:

an alkaline aqueous solution supply unit configured to supply to the substrate an alkaline aqueous solution, and a control unit configured to control a series of substrate processings, wherein the dissolving treatment solution supply unit is an organic solvent supply unit configured to supply an organic solvent as the dissolving treatment solution, and the control unit controls the stripping treatment solution supply unit, the organic solvent supply unit, and the alkaline aqueous solution supply unit so that a process of supplying to the treatment film the stripping treatment solution is performed, and then a process of supplying to the substrate the alkaline aqueous solution is performed, and then a process of supplying to the substrate the organic solvent is performed.

(8) The substrate processing system according to any one of (3) to (7), wherein the stripping treatment solution supply unit supplies pure water as the stripping treatment solution.

(9) The substrate processing system according to (5), wherein the stripping treatment solution supply unit supplies, as the stripping treatment solution, the organic solvent diluted with pure water.

(10) The substrate processing system according to (9), wherein the organic solvent is isopropyl alcohol, and as the stripping treatment solution, it is diluted to the concentration of 10% or less.

(11) The substrate processing system according to (1), comprising:

a rinsing solution supply unit configured to supply to the substrate a rinsing solution, and a control unit configured to control a series of substrate processings, wherein the removing solution supply unit supplies, as the removing solution, an alkaline aqueous solution diluted with pure water, and the control unit controls the removing solution supply unit and the rinsing solution supply unit so that a process of supplying to the treatment film the diluted alkaline aqueous solution, and then a process of supplying to the substrate the rinsing solution.

(12) The substrate processing system according to (1), comprising:

a control unit configured to control a series of substrate processings, wherein the removing solution supply unit supplies, as the removing solution, an organic solvent diluted with pure water, and the control unit controls the removing solution supply unit so that a process of supplying to the treatment film the diluted organic solvent is performed.

(13) The substrate processing system according to any one of (1) to (12), comprising a film-forming treatment solution supply unit configured to supply to the substrate a film-forming treatment solution comprising the organic solvent and the polymer, wherein the treatment film is formed on the substrate by solidification or curing of the supplied film-forming treatment solution.

(14) The substrate processing system according to (13), comprising a chamber that accommodates the film-forming treatment solution supply unit, the holding unit, and the removing solution supply unit.

(15) The substrate processing system according to (13), comprising:

a first chamber that accommodates the film-forming treatment solution supply unit; and a second chamber that accommodates the holding unit and the removing solution supply unit.

(16) The substrate processing system according to (15), comprising a film-formation facilitating unit configured to facilitate solidification or curing of the film-forming treatment solution, wherein the first chamber further accommodates the film-formation facilitating unit.

(17) The substrate processing system according to (14), comprising a film-formation facilitating unit configured to facilitate solidification or curing of the film-forming treatment solution, wherein the chamber further accommodates the film-formation facilitating unit.

(18) The substrate processing system according to (15), comprising a film-formation facilitating unit configured to facilitate solidification or curing of the film-forming treatment solution, wherein the second chamber further accommodates the film-formation facilitating unit.

(19) The substrate processing system according to (15), comprising further:

a film-formation facilitating unit configured to facilitate solidification or curing of the film-forming treatment solution; and a third chamber which accommodates the film-formation facilitating unit.

(20) The substrate processing system according to (15), comprising:

a film-formation facilitating unit configured to facilitate solidification or curing of the film-forming treatment solution; and a transfer section configured to transfer the substrate between the first chamber and the second chamber, wherein the film-formation facilitating unit is arranged in the transfer section.

(21) The substrate processing system according to (20), wherein the transfer section includes a substrate transfer device configured to transfer the substrate while holding the substrate and a transfer pathway of the substrate transfer device, and the film-formation facilitating unit is arranged in the substrate transfer device or in the transfer pathway.

(22) The substrate processing system according to any one of (13) to (21), wherein the film-forming treatment solution contains water at an amount of 20% or less by mass relative to total mass of the organic solvent and the water.

(23) The substrate processing system according to any one of (2) to (22), wherein the treatment film further contains a low-molecular organic acid.

(24) The substrate processing system according to (23), wherein the low-molecular organic acid is a polycarboxylic acid.

(25) A substrate cleaning method comprising:

a film-forming treatment solution supply step of supplying to a substrate, a film-forming treatment solution comprising an organic solvent and a fluorine-containing polymer that is soluble in the organic solvent; and a removing solution supply step of supply to a treatment film formed by solidification or curing of the film-forming treatment solution on the substrate, a removing solution capable of stripping the treatment film from the substrate and dissolving it.

(26) A non-transitory computer-readable recording medium storing a program that is executable by a computer and controls a substrate cleaning system, wherein upon execution of the program, the computer controls the substrate cleaning system so that the substrate cleaning method according to (25) is performed.

EXPLANATION OF REFERENCES

W: Wafer
P: Particle
1 and 1': Substrate cleaning system
2: Carry-in/out station
3: Processing station
4: Control device
14: Substrate cleaning device
20: Chamber
21: FFU
30: Substrate holding mechanism
40_1 and 40_2: Solution supply unit
45a: DIW source
45b: Alkaline aqueous solution source
45c: Organic solvent source
45d: DIW source
45e: IPA source
45f: Pretreatment solution source
45g: A+B source
45h: C source
45i: Diluted organic solvent source
46a to 46c, 46g, and 46h: Flow rate controller
60: Baking device
70: Heat source

The invention claimed is:

1. A substrate cleaning system comprising:
a holding unit configured to hold a substrate that has a treatment film formed thereon, wherein the treatment film comprises a solvent and a fluorine-containing polymer that is soluble in the solvent; and
a removing solution supply unit configured to supply to the treatment film formed on the substrate, a removing solution capable of removing the treatment film from the substrate,
wherein the removing solution supply unit comprises a stripping treatment solution supply unit configured to supply to the treatment film, a stripping treatment solution capable of stripping the treatment film from the substrate such that the treatment film stripped from the substrate is in a state of a film, and
wherein the polymer has a partial structure represented by the following formula (1):

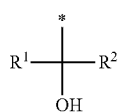

(1)

wherein
$R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1 to 8 carbon atoms; and
the symbol * shows a bonding site with another atom constituting the polymer.

2. The substrate cleaning system according to claim 1, comprising:
a rinsing solution supply unit configured to supply to the substrate a rinsing solution, and
a control unit configured to control a series of substrate processings, wherein
the stripping treatment solution supply unit supplies an alkaline aqueous solution diluted with pure water as the stripping treatment solution, and
the control unit controls the stripping treatment solution supply unit and the rinsing solution supply unit so that a process of supplying to the treatment film the alkaline aqueous solution diluted with pure water is performed, and then a process of supplying to the substrate the rinsing solution is performed.

3. The substrate cleaning system according to claim 1, comprising a film-forming treatment solution supply unit configured to supply to the substrate a film-forming treatment solution comprising the solvent and the polymer, wherein
the treatment film is formed on the substrate by solidification or curing of the supplied film-forming treatment solution.

4. The substrate cleaning system according to claim 3, comprising a chamber that accommodates the film-forming treatment solution supply unit, the holding unit, and the removing solution supply unit.

5. The substrate cleaning system according to claim 4, wherein the chamber further accommodates a film-formation facilitating unit configured to facilitate solidification or curing of the film-forming treatment solution.

6. The substrate cleaning system according to claim 1, wherein the treatment film further contains a low-molecular organic acid.

7. The substrate cleaning system according to claim 6, wherein the low-molecular organic acid is a polycarboxylic acid.

8. The substrate cleaning system according to claim 3, wherein the film-forming treatment solution contains water at an amount of 20% or less by mass relative to total mass of the solvent and the water.

9. A substrate cleaning method comprising:
a film-forming treatment solution supply step of supplying to a substrate, a film-forming treatment solution comprising a solvent and a fluorine-containing polymer that is soluble in the solvent; and
a removing solution supply step of supplying to a treatment film formed by solidification or curing of the film-forming treatment solution on the substrate, a removing solution capable of removing the treatment film from the substrate,
wherein the removing solution supply step comprises a stripping treatment solution supply step of supplying to the treatment film, a stripping treatment solution capable of stripping the treatment film from the substrate such that the treatment film stripped from the substrate is in a state of a film, and
wherein the polymer has a partial structure represented by the following formula (1):

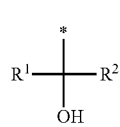

(1)

wherein

R$^1$ and R$^2$ each independently represents a hydrogen atom, a fluorine atom, an alkyl group having 1 to 8 carbon atoms, or a fluorinated alkyl group having 1 to 8 carbon atoms, provided that at least one of R$^1$ and R$^2$ is a fluorine atom or a fluorinated alkyl group having 1 to 8 carbon atoms; and the symbol * shows a bonding site with another atom constituting the polymer.

10. A non-transitory computer-readable recording medium storing a program that is executable by a computer and controls a substrate cleaning system, wherein upon execution of the program, the computer controls the substrate cleaning system so that the substrate cleaning method according to claim 9 is performed.

11. The substrate cleaning system according to claim 1, wherein the stripping treatment solution is at least one selected from pure water, pure water mixed with $CO_2$ gas, an alkaline aqueous solution, and isopropyl alcohol diluted with pure water.

12. The substrate cleaning method according to claim 9, wherein the stripping treatment solution is at least one selected from pure water, pure water mixed with $CO_2$ gas, an alkaline aqueous solution, and isopropyl alcohol diluted with pure water.

* * * * *